(12) United States Patent
Liu et al.

(10) Patent No.: US 12,087,597 B2
(45) Date of Patent: Sep. 10, 2024

(54) SEMICONDUCTOR STRUCTURE COMPRISING VARIOUS VIA STRUCTURES

(71) Applicant: TAIWAN SEMICONDUCTOR MANUFACTURING COMPANY LTD., Hsinchu (TW)

(72) Inventors: Jen-Fu Liu, Hsinchu (TW); Ming Hung Tseng, Miaoli County (TW); Yen-Liang Lin, Taichung (TW); Li-Ko Yeh, Hsinchu (TW); Hui-Chun Chiang, Hsinchu (TW); Cheng-Chieh Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/331,961

(22) Filed: Jun. 9, 2023

(65) Prior Publication Data

US 2023/0326766 A1  Oct. 12, 2023

Related U.S. Application Data

(62) Division of application No. 17/378,356, filed on Jul. 16, 2021, now Pat. No. 11,715,646.

(51) Int. Cl.
*H01L 21/48* (2006.01)
*H01L 21/56* (2006.01)
(Continued)

(52) U.S. Cl.
CPC ........ *H01L 21/486* (2013.01); *H01L 21/4857* (2013.01); *H01L 21/565* (2013.01); *H01L 23/3121* (2013.01); *H01L 23/49822* (2013.01); *H01L 23/49838* (2013.01); *H01L 24/05* (2013.01); *H01L 24/19* (2013.01);
(Continued)

(58) Field of Classification Search
CPC ............... H01L 21/565; H01L 23/3121; H01L 23/49822; H01L 24/05; H01L 24/19; H01L 24/20; H01L 24/32; H01L 24/33; H01L 24/83; H01L 24/94; H01L 2224/2101; H01L 2224/32145; H01L 2224/32225; H01L 2224/33181; H01L 2924/181
USPC ........ 257/774; 438/629, 637, 639, 640, 667, 438/668, 672, 675, 700, 701, 713, 978
See application file for complete search history.

(56) References Cited

U.S. PATENT DOCUMENTS 8,802,504 B1   8/2014  Hou et al.
8,803,292 B2   8/2014  Chen et al.
(Continued)

*Primary Examiner* — Didarul A Mazumder
(74) *Attorney, Agent, or Firm* — WPAT LAW; Anthony King

(57) ABSTRACT

A semiconductor structure includes a first die; a second die disposed over the first die; a plurality of first conductive vias adjacent to the first die. The semiconductor structure further includes a plurality of second conductive vias disposed over the first conductive vias, each of the second conductive vias corresponding to one of the first conductive vias; a plurality of third conductive vias disposed over the first die and adjacent to the second die; and a molding material encapsulating the first die, the second die, the first conductive vias, the second conductive vias and the third conductive vias. A stepped shape is formed around an interface between each of the first conductive vias and the corresponding one of the second conductive vias.

20 Claims, 21 Drawing Sheets

(51) Int. Cl.
    *H01L 23/00*     (2006.01)
    *H01L 23/31*     (2006.01)
    *H01L 23/498*     (2006.01)
    *H01L 25/00*     (2006.01)
    *H01L 25/065*     (2023.01)

(52) U.S. Cl.
    CPC ............... *H01L 24/20* (2013.01); *H01L 24/32* (2013.01); *H01L 24/33* (2013.01); *H01L 24/83* (2013.01); *H01L 24/94* (2013.01); *H01L 25/0657* (2013.01); *H01L 25/50* (2013.01); *H01L 2224/2101* (2013.01); *H01L 2224/32145* (2013.01); *H01L 2224/32225* (2013.01); *H01L 2224/33181* (2013.01); *H01L 2924/181* (2013.01); *H01L 2924/37001* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,825,007 B1 * | 11/2017 | Chen .................... H01L 21/4857 |
| 10,734,357 B2 * | 8/2020 | Chen .................... H01L 21/4857 |
| 2018/0122780 A1 * | 5/2018 | Chen ................. H01L 23/49811 |
| 2020/0402941 A1 * | 12/2020 | Olson ..................... H01L 24/11 |

\* cited by examiner

SEMICONDUCTOR STRUCTURE COMPRISING VARIOUS VIA STRUCTURES

CROSS-REFERENCE TO RELATED APPLICATION

This application is a divisional application of a U.S. patent application entitled METHOD FOR FORMING A SEMICONDUCTOR STRUCTURE COMPRISING VARIOUS VIA STRUCTURES, Ser. No. 17/378,356, filed on Jul. 16, 2021.

BACKGROUND

The semiconductor industry has experienced rapid growth due to ongoing improvements in the integration density of a variety of components (e.g., photoelectric devices and electrical components, etc.). To accommodate the miniaturized scale of the semiconductor device, various technologies and applications have been developed for the wafer-level packaging, involving greater numbers of different components with different functions.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
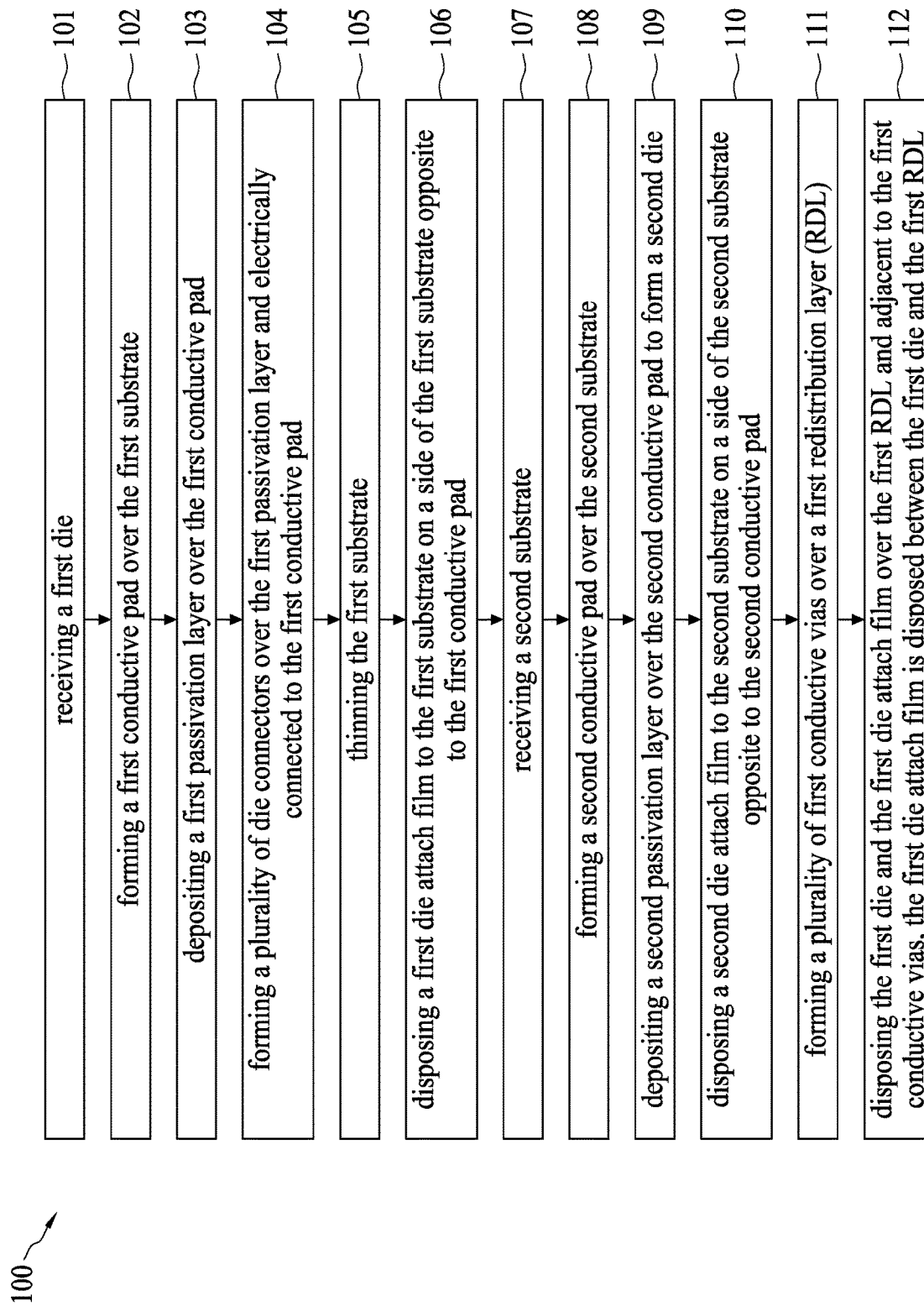
FIGS. 1A and 1B collectively illustrate a flowchart of a method, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially." "approximately" and "about" generally mean within a value or range that can be contemplated by people having ordinary skill in the art. Alternatively, the terms "substantially." "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially." "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As the demand for shrinking electronic devices has grown, a need for smaller and more creative packaging techniques of semiconductor structures has emerged. An example of such packaging systems is integrated fan-out (InFO) packages. In an InFO package, a top semiconductor die is surrounded by a molding structure and stacked on top of a bottom semiconductor die to provide a high level of integration and component density, and the molding structure and the stacked top semiconductor die and the bottom semiconductor die are surrounded by another molding structure. As such, the top semiconductor die is surrounded by two molding structures, and the semiconductor package includes different molding materials. InFO package generally enables production of semiconductor structures with enhanced functionalities, but suffers from problems of coefficient of thermal expansion (CTE) mismatch of the different materials.

Figure 1B:
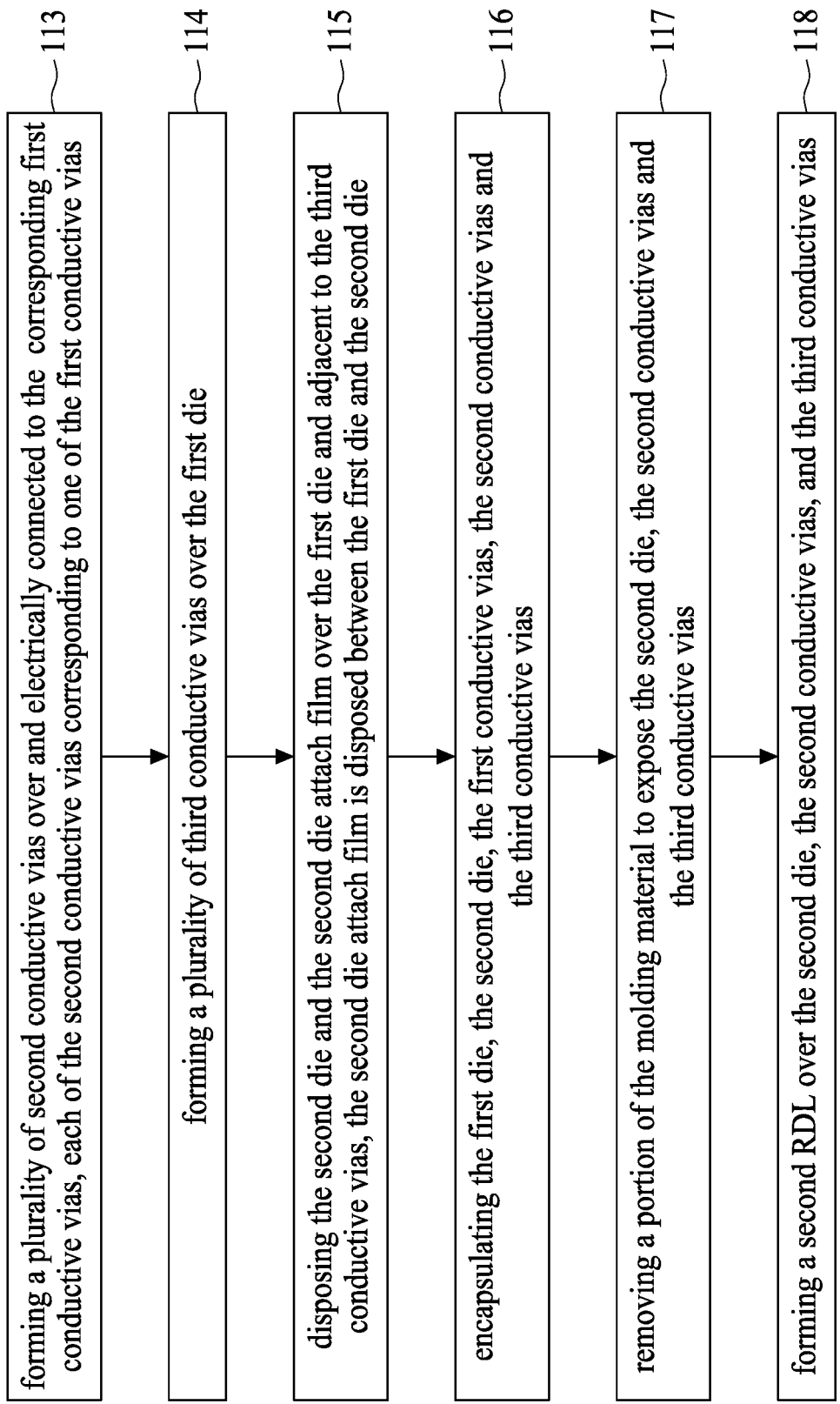

FIGS. 1A and 1B collectively illustrate a flowchart of a method 100 of manufacturing a semiconductor device, in accordance with some embodiments. Additional steps can be provided before, during, and after the steps shown in FIGS. 1A and 1B, and some of the steps described below can be replaced or eliminated in other embodiments of the method 100. The order of the steps may be interchangeable. FIGS. 2 to 16 are schematic cross-sectional views illustrating exemplary operations for the method of manufacturing a semiconductor structure, e.g., illustrated in FIGS. 1A and 1B, according to one embodiment of the present disclosure.

Figure 2:
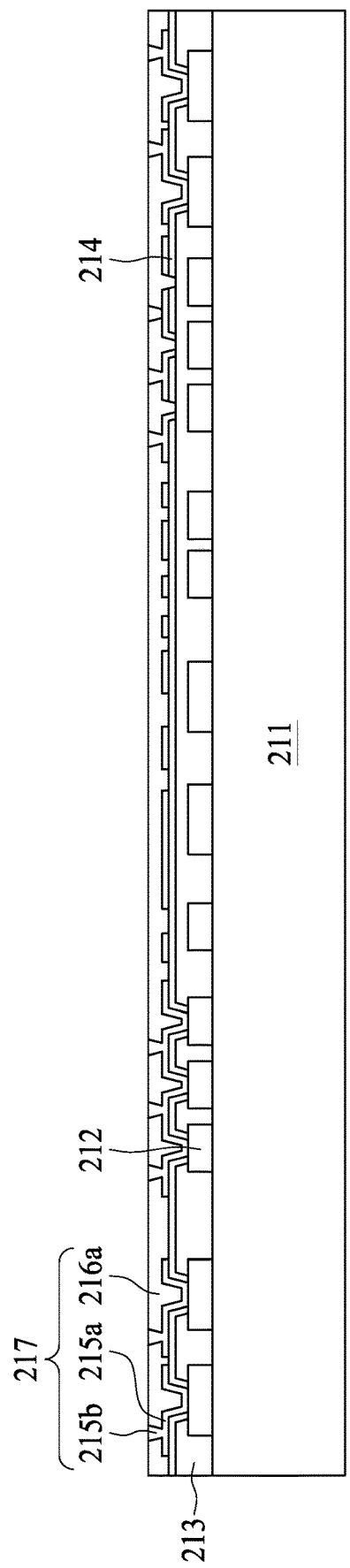
FIGS. 2 to 18 are cross-sectional views illustrating exemplary operations in a method of manufacturing a semiconductor structure, in accordance with some embodiments of the present disclosure.

Referring to FIGS. 1A and 2, in some embodiments, in step 101, a first substrate 211 is received. In step 102, a first conductive pad 212 is formed over the first substrate 211. In step 103, a first passivation layer 213 is disposed over the first conductive pad 212. Further, in step 104, a plurality of conductive lines 215a are formed over the first passivation layer 213 and electrically connected to the first conductive pad 212.

The first substrate 211 may be processed according to applicable manufacturing processes to form integrated circuits in the first substrate 211. In some embodiments, the first substrate 211 is a semiconductor substrate, such as a bulk semiconductor, a semiconductor-on-insulator (SOI) substrate, or the like, and may be doped (e.g., with a p-type or n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the first substrate 211 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In an embodiment, the first substrate 211 is a silicon wafer.

Devices, such as transistors, diodes, capacitors, resistors, etc., may be formed in and/or on the first substrate 211 and may be interconnected by metal layers formed by, for example, metallization patterns in one or more dielectric layers on the first substrate 211 to form an interconnect layer.

The first conductive pad 212, configured as a connector, is formed over the first substrate 211. The first conductive pad 212 may include aluminum or aluminum copper alloy. The first conductive pad 212 is electrically coupled to the respective circuits of the first substrate 211. In some embodiments, a plurality of the first conductive pads 212 are formed over the interconnect layer. In some embodiments, the first conductive pads 212 are formed on an active side of the first substrate 211. The shape of each of the first conductive pads 212 from a top-view perspective is not particularly limited, e.g., a circular shape, a polygonal shape, or the like, and may be adjusted according to the actual needs.

In some embodiments, one and more first passivation layers 213 are formed over the first substrate 211 and the first conductive pads 212. In some embodiments, one and more first passivation layers 213 are formed on the active side of the first substrate 211. In some embodiments, the first passivation layer 213 laterally encapsulates the first conductive pads 212. In some embodiments, the first passivation layer(s) 213 includes polyimide, borophosphosilicate glass (BPSG), silicon nitride (SiN), polybenzoxazole (PBO), a combination thereof, and/or the like, and may be formed using spin-on coating, chemical vapor deposition (CVD), atomic layer deposition (ALD), physical vapor deposition (PVD), or the like.

In some embodiments, openings are formed through the first passivation layer 213 to the first conductive pads 212, and portions of the first conductive pads 212 are exposed through these openings. In some embodiments, a dielectric layer 214 is formed over the first passivation layer 213. In some embodiments, the dielectric layer 214 is conformal to the first passivation layer 213. In some embodiments, the dielectric layer 214 is patterned. Openings are formed through the dielectric layer 214, and portions of the first conductive pads 212 are exposed through these openings.

In some embodiments, conductive lines 215a such as conductive pillars (for example, comprising metal such as copper), are formed in the openings through the dielectric layer 214 and on portions of the dielectric layer 214. The conductive lines 215a are mechanically and electrically coupled to the respective first conductive pads 212. The conductive lines 215a are electrically coupled to the circuits in the first substrate 211. The conductive lines 215a may be formed by, for example, plating, CVD, ALD, or the like. In some embodiments, the conductive lines 215a is patterned to expose a portion of the dielectric layer 214.

In some embodiments, a dielectric layer 216a is formed over the dielectric layer 214 and the conductive lines 215a. The dielectric layer 216a electrically insulated the conductive lines 215a. The dielectric layer 216a may include polymeric materials such as PBO, polyimide, BCB, or the like; nitride such as silicon nitride; oxide such as silicon oxide, PSG, BSG, BPSG; the like, or a combination thereof, and may be formed, for example, by spin coating, lamination, CVD, or the like.

In some embodiments, the dielectric layer 216a is then patterned to form openings. The openings expose portions of the conductive lines 215a. The patterning may be by an acceptable process, such as etching or exposing to light. In some embodiments, the patterned dielectric layer 216a laterally encapsulates the conductive lines 215a, and portions of the conductive lines 215a are exposed through the patterned dielectric layer 216a.

In some embodiments, conductive lines 215b such as conductive pillars (for example, comprising metal such as copper), are formed in the openings through the dielectric layer 216a and on portions of the conductive lines 215a. The conductive lines 215b are mechanically and electrically coupled to the respective conductive lines 215a. The conductive lines 215b are electrically coupled to the circuits in the first substrate 211. The conductive lines 215b may be formed by, for example, plating, CVD, ALD, or the like. In some embodiments, the conductive lines 215b disposed on the dielectric layer 216a is removed. In some embodiments, the dielectric layer 216a laterally encapsulates the conductive lines 215b, and portions of the conductive lines 215b are exposed through the dielectric layer 216a. In some embodiments, the conductive lines 215b are disposed at a upper surface of the first substrate 211 and surrounded by the dielectric layer 216a. In some embodiments, the shape of the conductive lines 215b from a top-view perspective includes a circular shape, a polygonal shape, or the like, and may be adjusted according to the actual needs.

In some embodiments, the dielectric layer 216b and the conductive lines 215a, 215b forms a redistribution layer (RDL) 217.

Figure 3:
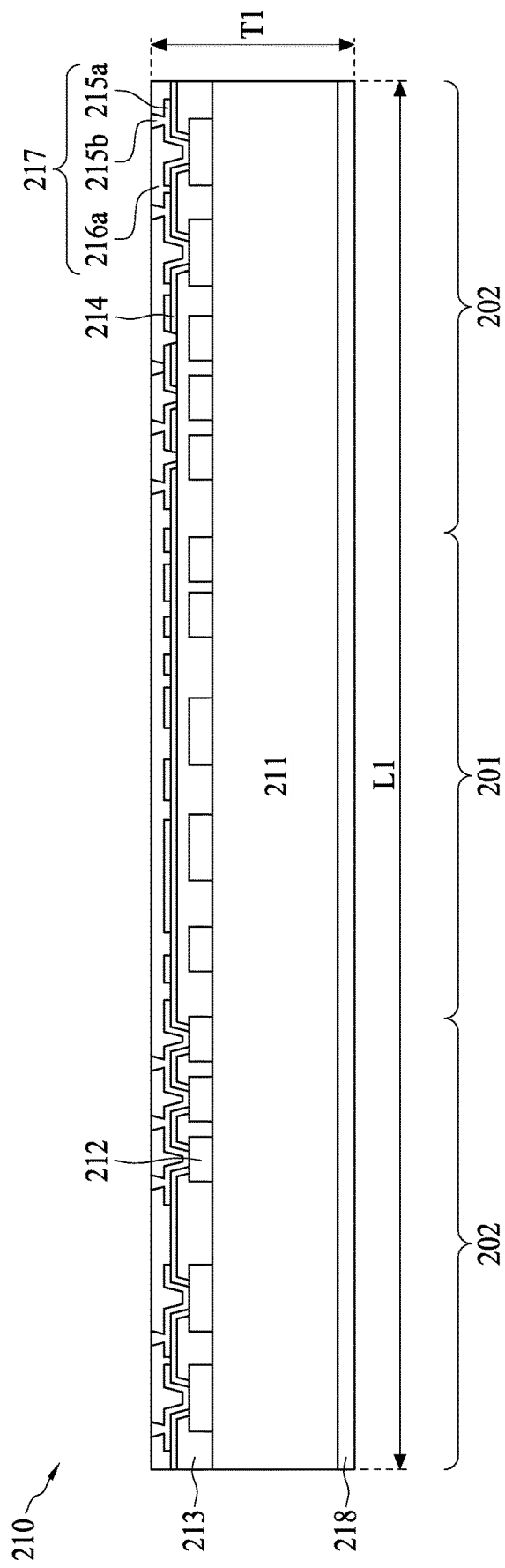

Referring to FIGS. 1A and 3, in some embodiments, in step 105, the first substrate 211 is thinned. In step 106, a first die attach film (DAF) 218 is disposed to the first substrate 211 on a side of the first substrate 211 opposite to the conductive lines 215b. In some embodiments, the first DAF 218 is absent from the first substrate 211.

In some embodiments, in step 105, the thinning operation is performed the first substrate 211 from a side, referred to herein as a backside, of the first substrate 211 opposite to the first conductive pad 212. In some embodiments, the thinning operation includes a planarization process such as a CMP process or a mechanical grinding process.

In some embodiments, the first DAF 218 may be an adhesive, epoxy, or the like. In some embodiments, the first DAF 218 is applied to the thinned first substrate 211. The first DAF 218 may be attached to the back-side of the first substrate 211. In some embodiments, a total thickness T1 of the first substrate 211 and the first DAF 218 ranges between 70 and 200 μm.

Subsequently, the first substrate 211 may be singulated to form individual first dies 210, such as by sawing or dicing. In some embodiments, each first die 210 includes a central portion 201 and a peripheral portion 202 surrounding the central portion 201. In some embodiments, the first conductive pads 212 are disposed in the central portion 201. In some embodiments, the RDL 217 redistributes the integrated circuits in the central portion 201 of each first die 210 to the peripheral portion 202 of the respective first die 210. In some embodiments, the conductive lines 215b are disposed in the peripheral portion 202.

The first die 210 may be a logic die (e.g., central processing unit, microcontroller, etc.), memory die (e.g., dynamic random access memory (DRAM) die, static random access memory (SRAM) die, etc.), power management die (e.g., power management integrated circuit (PMIC) die), radio frequency (RF) die, sensor die, micro-electro-mechanical-system (MEMS) die, signal processing die (e.g., digital signal processing (DSP) die), front-end die (e.g., analog front-end (AFE) dies), the like, or a combination thereof.

Figure 4:
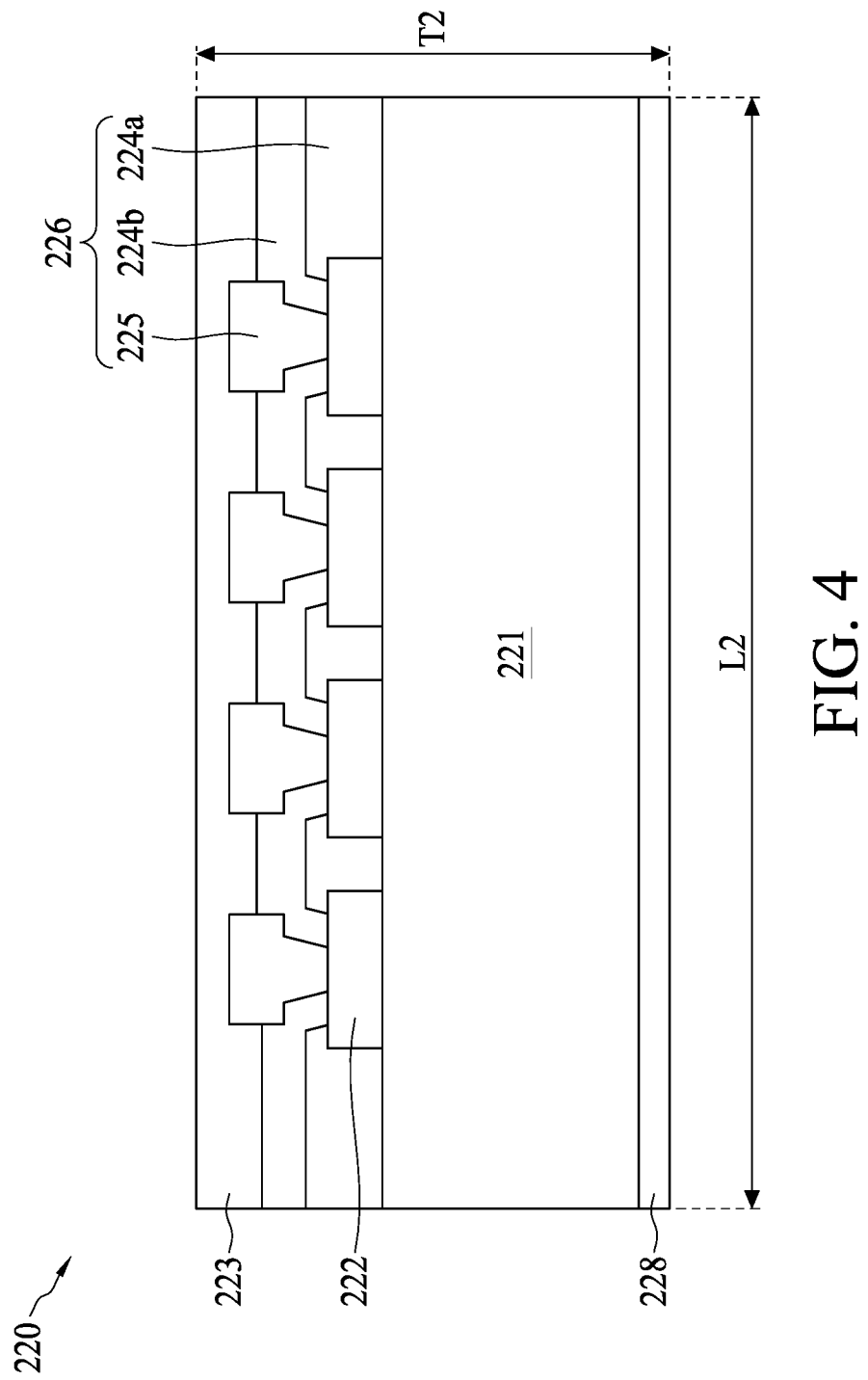

Referring to FIGS. 1A and 4, in some embodiments, in step 107, a second substrate 221 is received. In step 108, a second conductive pad 222 is formed over the second substrate 221. In step 109, a second passivation layer 223 is disposed over the second conductive pad 222 to form a second die 220. In step 110, a second die attach film (DAF) 228 is disposed to the second substrate 221 on a side of the second substrate 221 opposite to the second conductive pad 222.

The second substrate 221 may be processed according to applicable manufacturing processes to form integrated circuits in the second substrate 221. In some embodiments, the second substrate 221 is a semiconductor substrate, such as a bulk semiconductor, a semiconductor-on-insulator (SOI) substrate, or the like, and may be doped (e.g., with a p-type or n-type dopant) or undoped. In some embodiments, the semiconductor material of the second substrate 221 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the second substrate 221 is a silicon wafer.

Devices, such as transistors, diodes, capacitors, resistors, etc., may be formed in and/or on the second substrate 221 and may be interconnected by metal layers formed by, for example, metallization patterns in one or more dielectric layers on the second substrate 221 to form an interconnect layer.

The second conductive pad 222, configured as a connector, is formed over the second substrate 221. The second conductive pad 222 may include aluminum or aluminum copper alloy. The second conductive pad 222 is electrically coupled to the respective circuits of the second substrate 221. In some embodiments, a plurality of the second conductive pad 222 are formed over the interconnect layer. In some embodiments, the second conductive pad 222 are formed on an active side of the second substrate 221. The shape of each of the second conductive pad 222 from a top-view perspective is not particularly limited, e.g., a circular shape, a polygonal shape, or the like, and may be adjusted according to the actual needs.

In some embodiments, one and more dielectric layers 224a, 224b are disposed formed over the second substrate 221 and over the second conductive pad 222. In some embodiments, the dielectric layer 224a is formed on the active sides of the second substrate 221. In some embodiments, the dielectric layer 224a includes a polyimide, a BPSG, SiN, PBO, a combination thereof, and/or the like, and may be formed using a spin-on coating, CVD, ALD, PVD, a combination thereof, and/or the like.

In some embodiments, openings are formed through the dielectric layers 224a to the second conductive pads 222, and portions of the second conductive pads 222 are exposed through these openings. In some embodiments, a dielectric layer 224b is formed over the dielectric layers 224a. In some embodiments, the dielectric layer 224b is conformal to the dielectric layers 224a. In some embodiments, the dielectric layer 224b is patterned. Openings are formed through the dielectric layer 224b, and portions of the second conductive pads 222 are exposed through these openings.

In some embodiments, conductive lines 225 such as conductive pillars (for example, comprising metal such as copper), are formed in the openings through the dielectric layers 224a, 224b and on portions of the dielectric layer 224b. The conductive lines 225 are mechanically and electrically coupled to the respective second conductive pads 222. The conductive lines 225 are electrically coupled to the circuits in the second substrate 221. The conductive lines 225 may be formed by, for example, plating, CVD, ALD, or the like. In some embodiments, the conductive lines 225 is patterned to expose a portion of the dielectric layer 214b.

In some embodiments, the dielectric layers 224a, 224b and the conductive lines 225 forms a redistribution layer (RDL) 226.

In some embodiments, one and more second passivation layers 223 are formed over the second substrate 221 and the second conductive pad 222. In some embodiments, the second passivation layers 223 are formed over the dielectric layer 224b and the conductive lines 225. In some embodiments, the second passivation layer(s) 223 includes polyimide, BPSG, SiN, PBO, a combination thereof, and/or the like, and may be formed using spin-on coating, CVD, ALD, PVD, or the like. In some embodiments, at least one of the second passivation layers 223 covers the conductive lines 225. In some embodiments, a portion of the second passivation layer 223 may be further removed to expose the conductive lines 225 in the following step of the method 100.

In some embodiments, the second DAF 228 may be an adhesive, epoxy, or the like. The second DAF 228 may be attached to a back-side of the second substrate 221. In some embodiments, the second DAF 228 is absent. In some embodiments, a total thickness T2 of the second substrate 221 and the second DAF 228 ranges between 70 μm and 150 μm. In some embodiments, a total thickness T2 is less than the total thickness T1.

The second substrate 221 may be singulated to form individual second dies 220, such as by sawing or dicing, after the second DAF 228 is disposed.

The configurations and materials of the second substrate 221, the second conductive pad 222, the dielectric layer 224a. 224b, the conductive lines 225 and the second passivation layer 223 of the second die 220 may be similar to their corresponding parts in the first die 210, and detailed descriptions are not repeated herein.

The second die 220 may be a logic die (e.g., central processing unit, microcontroller, etc.), memory die (e.g., dynamic random access memory (DRAM) die, static random access memory (SRAM) die, etc.), power management die (e.g., power management integrated circuit (PMIC) die), radio frequency (RF) die, sensor die, micro-electro-mechanical-system (MEMS) die, signal processing die (e.g., digital signal processing (DSP) die), front-end die (e.g., analog front-end (AFE) dies), the like, or a combination thereof.

In some embodiments, referring to FIGS. 3 and 4, a first size L1 such as a length of the first die 210 is greater than a second size L2 such as a length of the second die 220. In some embodiments, an area of the first die 210 is greater than an area of the second die 220. The length and area of each of the first die 210 and the second 220 are not particularly limited and can be adjusted according to application requirements.

Figure 5:
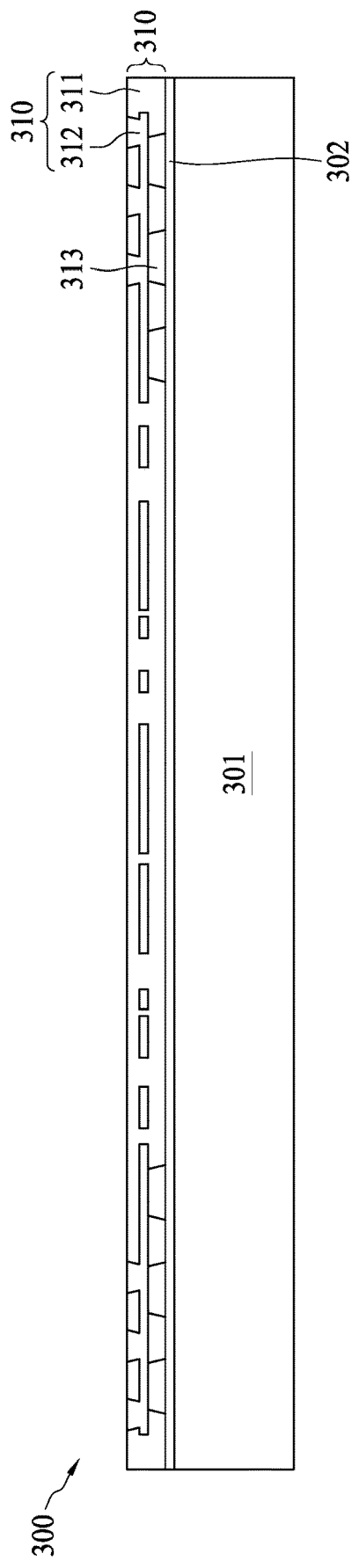

In some embodiments, as shown in FIG. 5, a carrier substrate 301 is received. The carrier substrate 301 may be a glass substrate, a ceramic substrate, a wafer, or the like. In some embodiments, a release layer 302 is formed on the carrier substrate 301. The release layer 302 may be removed along with the carrier substrate 301 from the overlying structures that will be formed in subsequent steps. In some embodiments, the release layer 302 is an epoxy-based thermal-release material, which loses its adhesive property when heated, such as a light-to-heat-conversion (LTHC) release coating. In some embodiments, the release layer 302 may be a ultra-violet (UV) glue, which loses its adhesive property when exposed to UV lights. The release layer 302 may be formed by dispensing liquid release materials over the carrier substrate 301 and curing the liquid materials. In some embodiments, the release layer 302 may be a laminate film laminated onto the carrier substrate 301. The top surface of the release layer 302 may be flat. In some embodiments, a semiconductor structure 300 includes a carrier substrate 301 and a release layer 302.

In some embodiments, a first RDL 310 is formed over the carrier substrate 301. In some embodiments, the first RDL 310 includes a first dielectric layer 311 over the carrier substrate 301 and the release layer 302, and a first metal layer 312 embedded by the first dielectric layer 311. In some embodiments, portions of the first metal layer 312 are exposed through the first dielectric layer 311.

In some embodiments, the first RDL 310 is a multi-layer structure. In some embodiments, the first dielectric layer 311 includes a plurality of layers of dielectric materials formed in a stack over the carrier substrate 301 and the release layer 302. In some embodiments, the first metal layer 312 includes a plurality of conductive patterns distributed within the plurality of layers of dielectric materials. In some embodiments, the conductive patterns include conductive lines and conductive vias. In some embodiments, the conductive lines extend horizontally in at least one layer of dielectric materials, and the conductive lines electrically couple the adjacent conductive lines in adjacent layers of the dielectric materials. In some embodiments, the conductive vias of the first metal layer 312 are tapered from the upper surface of the first dielectric layer 311 towards the conductive lines of the first metal layer 312.

The first dielectric layer 311 may include a polymer such as PBO, polyimide, BCB, or the like; a nitride such as silicon nitride; an oxide such as silicon oxide, PSG, BSG, BPSG; the like, or a combination thereof, and may be formed, for example, by any acceptable deposition process, such as spin coating, chemical vapor deposition (CVD), laminating, the like, or a combination thereof. In some embodiments, the first metal layer 312 comprises a titanium layer and a copper layer over the titanium layer.

In some embodiments, a conductive pad 313 is disposed between the first metal layer 312 and the release layer 302. In some embodiments, the conductive pad 313 is mechanically and electrically coupled to the first metal layer 312. In some embodiments, the conductive pad 313 is in contact with the release layer 302. In some embodiments, the conductive pad 313 is laterally encapsulated by of the first dielectric layer 311 of the first RDL 310. In some embodiments, material of the conductive pad 313 is different from the material of the first metal layer 312. In some embodiments, the conductive pad 313 includes solder. In some embodiments, the conductive pad 313 is tapered from the release layer 302 towards the conductive lines of the first metal layer 312.

Figure 6:
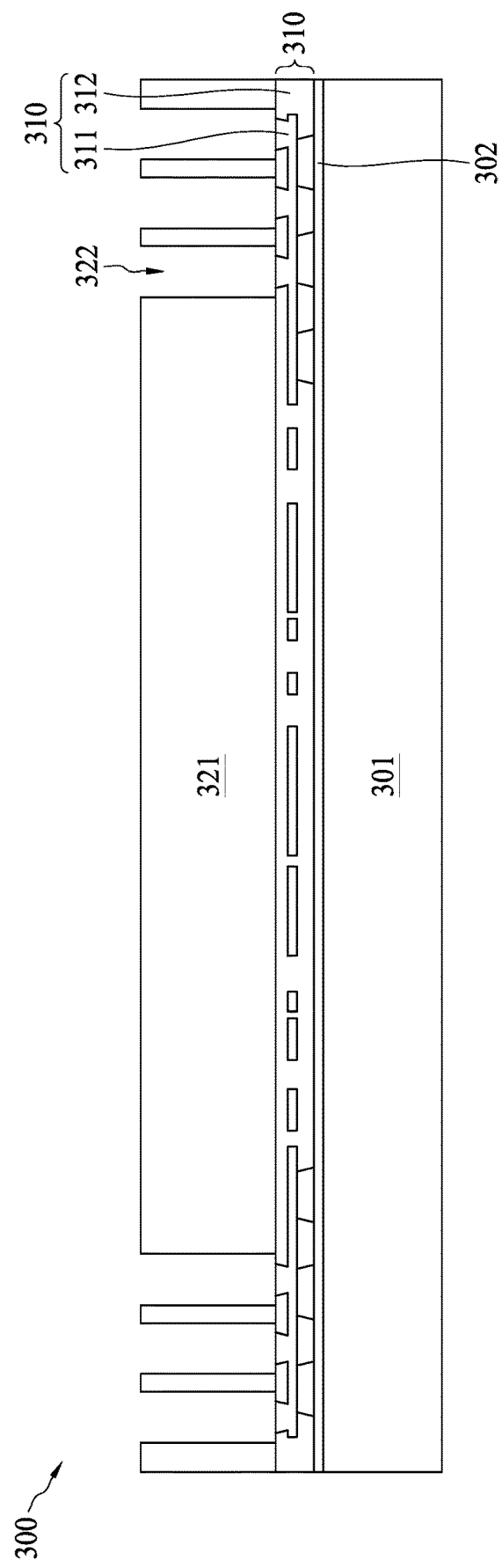

In some embodiments, as shown in FIG. 6, a photoresist 321 is formed over the first RDL 310. The photoresist 321 may be formed by spin coating and may be exposed to light for patterning. The patterning operation forms openings 322 through the photoresist 321 to expose portions of the first metal layer 312 of the first RDL 310.

Figure 7:
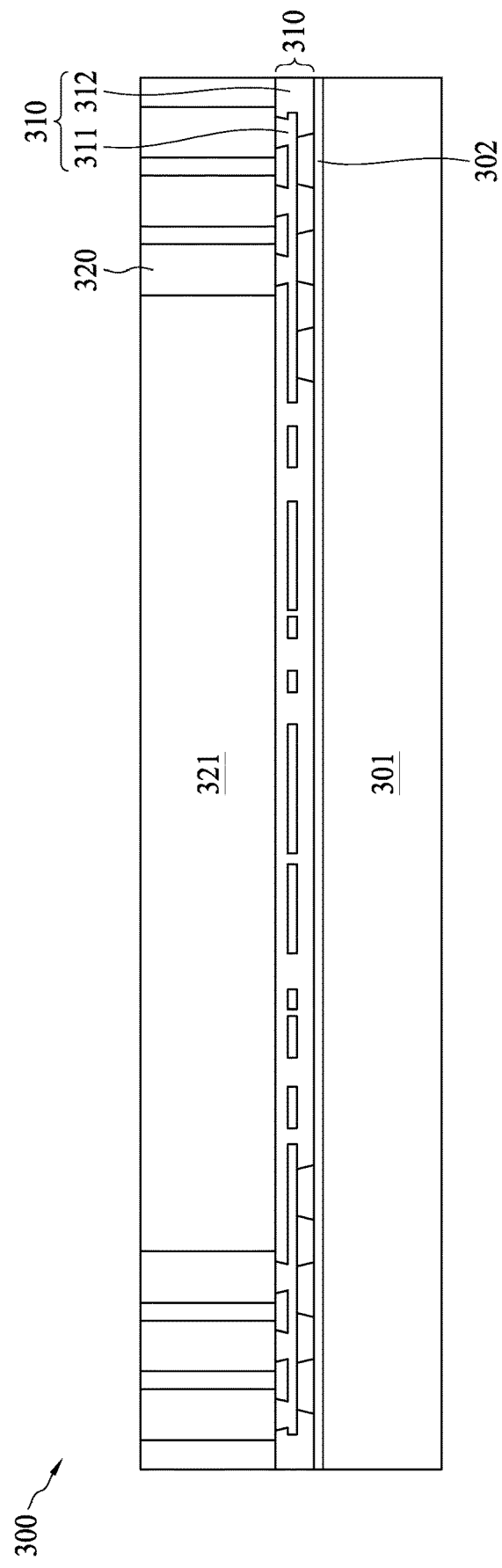

In some embodiments, as shown in FIG. 7, a conductive material is deposited in the openings 322 of the photoresist 321 and over the first RDL 310 to be electrically connected to the first metal layer 312. The conductive material may be deposited by CVD or plating, such as electroplating or electroless plating, or the like. The conductive material may comprise metal, such as copper, titanium, tungsten, aluminum, or the like. A planarization operation may be performed to remove the excess materials of the conductive material over the photoresist 321 and level the upper surfaces of the conductive material. The first conductive vias 320 are thus formed in the openings 322.

Figure 8:
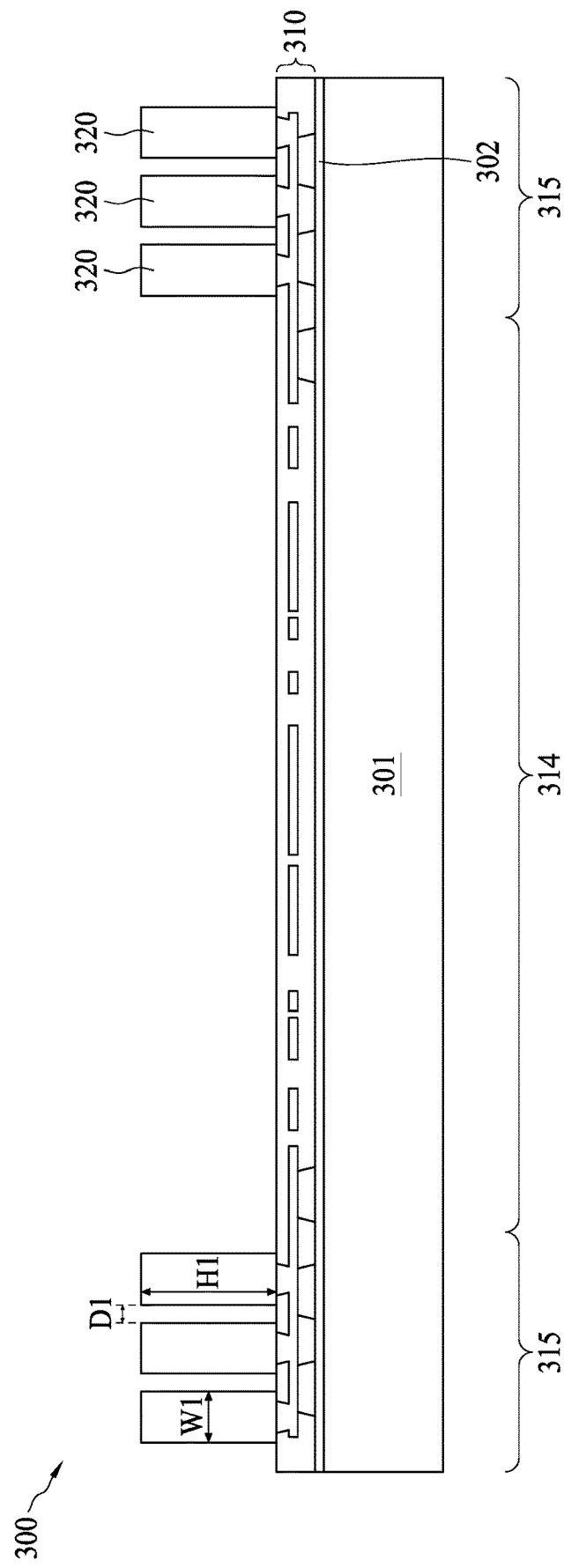

In some embodiments, as shown in FIG. 8, the photoresist 321 is removed. The photoresist 321 may be removed by an acceptable washing or stripping process, such as using an oxygen plasma or the like.

In some embodiments, the first conductive vias 320 are disposed in a peripheral portion 315 of the first RDL 310. The peripheral portion 315 of the first RDL 310 surrounds a central portion 314 of the first RDL 310 from a top-view perspective. The area of the central portion 314 of the first RDL is adjusted according to the size L1 and the area of the first die 210, as shown in FIG. 3.

In some embodiments, a height H1 of each of the first conductive vias 320 is in a range between about 70 μm and about 200 μm. In some embodiments, the height H1 of the first conductive vias 320 are substantially equal. In some embodiments, a width W1 of each of the first conductive vias 320 is in a range between about 100 μm and about 400 μm. In some embodiments, the widths W1 of the first conductive vias 320 may be similar to or different from each other. In some embodiments, a distance D1 between the adjacent first conductive vias 320 is in a range between about 100 μm and about 350 μm. In some embodiments, the distances D1 between the different pairs of adjacent first conductive vias 320 may be similar or different.

Figure 9:
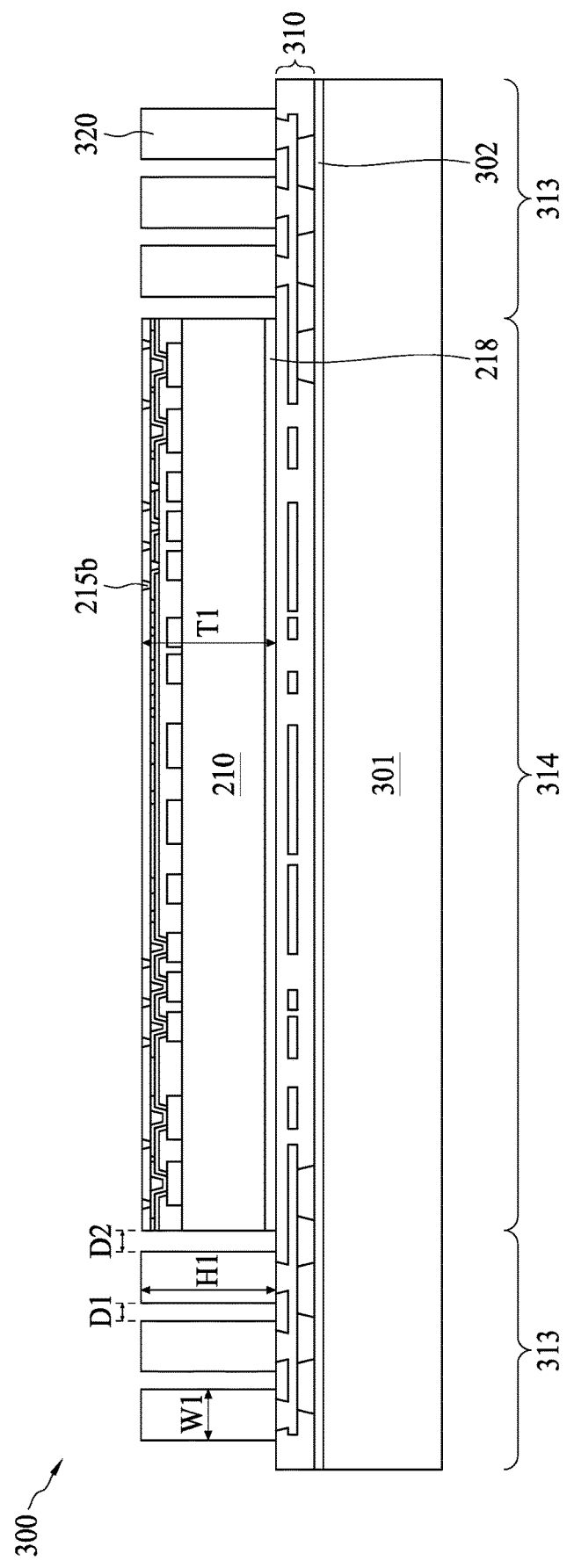

Referring to FIGS. 1A and 9, in some embodiments, in step 112, the first die 210 along with the first DAF 218 is disposed over the first RDL 310 and adjacent to the first conductive vias 320. The first DAF 218 is disposed between the first die 210 and the first RDL 310. In some embodiments, the first die 210 is adhered to the first RDL 310 through the first DAF 218. In some embodiments, the first die 210 may be adhered to the first RDL 310 by the first DAF 218 using, for example, a pick-and-place tool. In some embodiments, the first die 210 is disposed on the first RDL 310. In some embodiments where the first DAF 218 is absent, the first die 210 is in physical contact with the first RDL 310.

In some embodiments, the first die 210 is disposed in the central portion 314 of the first RDL 310. In some embodiments, a height H1 of each of the first conductive vias 320 is substantially equal to a thickness of the first die 210. In some embodiments, the total thickness T1 of the first die 210 and the first die attach film 218 is substantially equal to the height H1 of each of the first conductive vias 320. In some embodiments, top surfaces of the first conductive vias 320 are level with a top surface of the first die 210. In some embodiments, top surfaces of the conductive lines 215b are level with top surfaces of the first conductive vias 320. In some embodiments, the plurality of first conductive vias 320 and the first die 210 are coplanar.

In some embodiments, the first conductive vias 320 are adjacent to the first die 210. In some embodiments, the first conductive vias 320 surround the first die 210. In some embodiments, a distance D2 between the first die 210 and the adjacent first conductive via 320 is in a range between about 1 μm and about 500 μm. In some embodiments, the distance D2 is in a range between about 3 μm and about 100 μm. In some embodiments, the distance D2 is in a range about between 3 μm and about 70 μm. In some embodiments, the distances D2 between the first die 210 and different first conductive vias 320 may be similar to or different.

Referring to FIGS. 1B, 10, 11 and 12, in some embodiments, in step 113, a plurality of second conductive vias 330 are formed over and electrically connected to the first conductive vias 320. Each of the second conductive vias 330 corresponds to each of the first conductive vias 320. In step 114, a plurality of third conductive vias 340 are formed over the first die 210.

Figure 10:
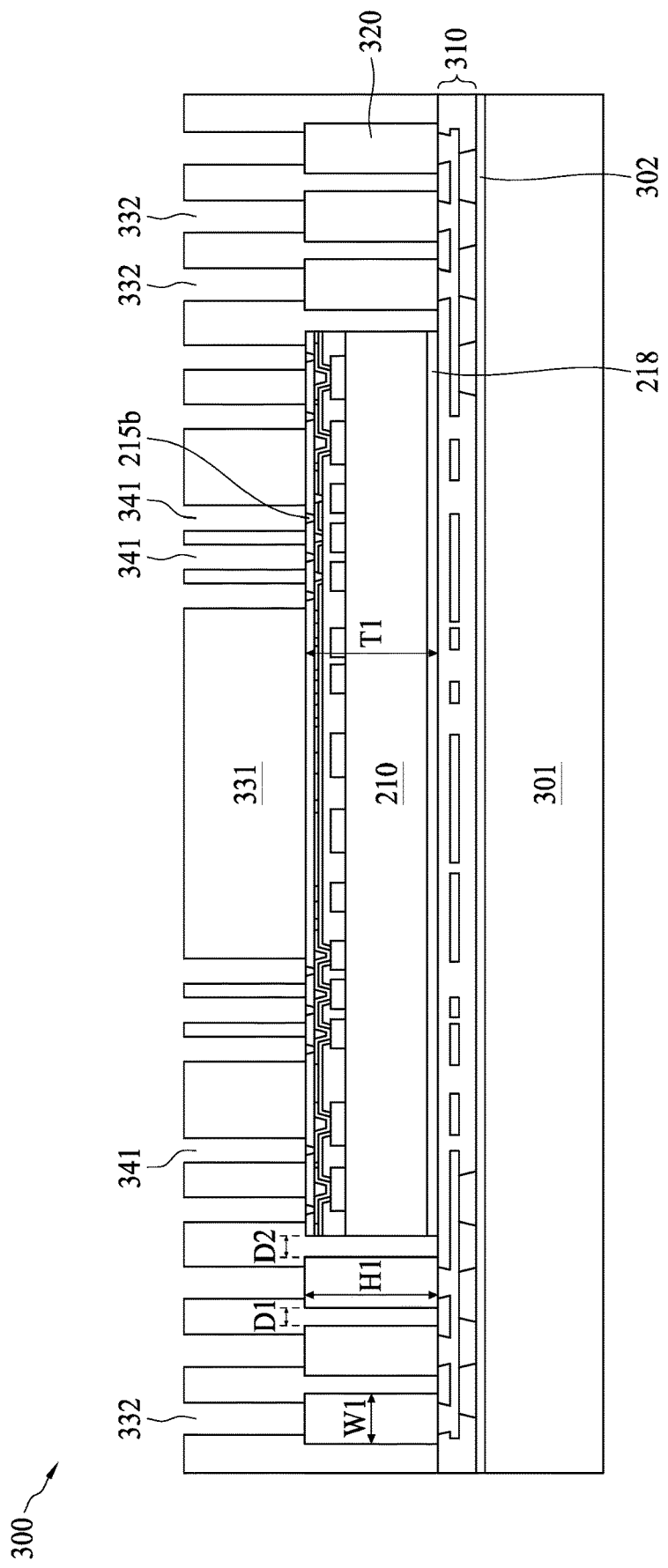

Referring to FIG. 10, a photoresist 331 is disposed over the first RDL 310, the first die 210 and the first conductive vias 320. Methods of forming the second conductive vias 330 and the third conductive vias 340 may be similar to the method of forming the first conductive vias 320. In some embodiments, the photoresist 331 is patterned to forming openings 332, 341. In some embodiments, openings 332, 341 are formed in the photoresist 331, and therefore portions of the first conducive vias 320 are exposed through the opening 332 and portions of the first die 210 are exposed through openings 341. In some embodiments, the conductive lines 215b of the first die 210 are exposed through the openings 341 of the photoresist 331.

Figure 11:
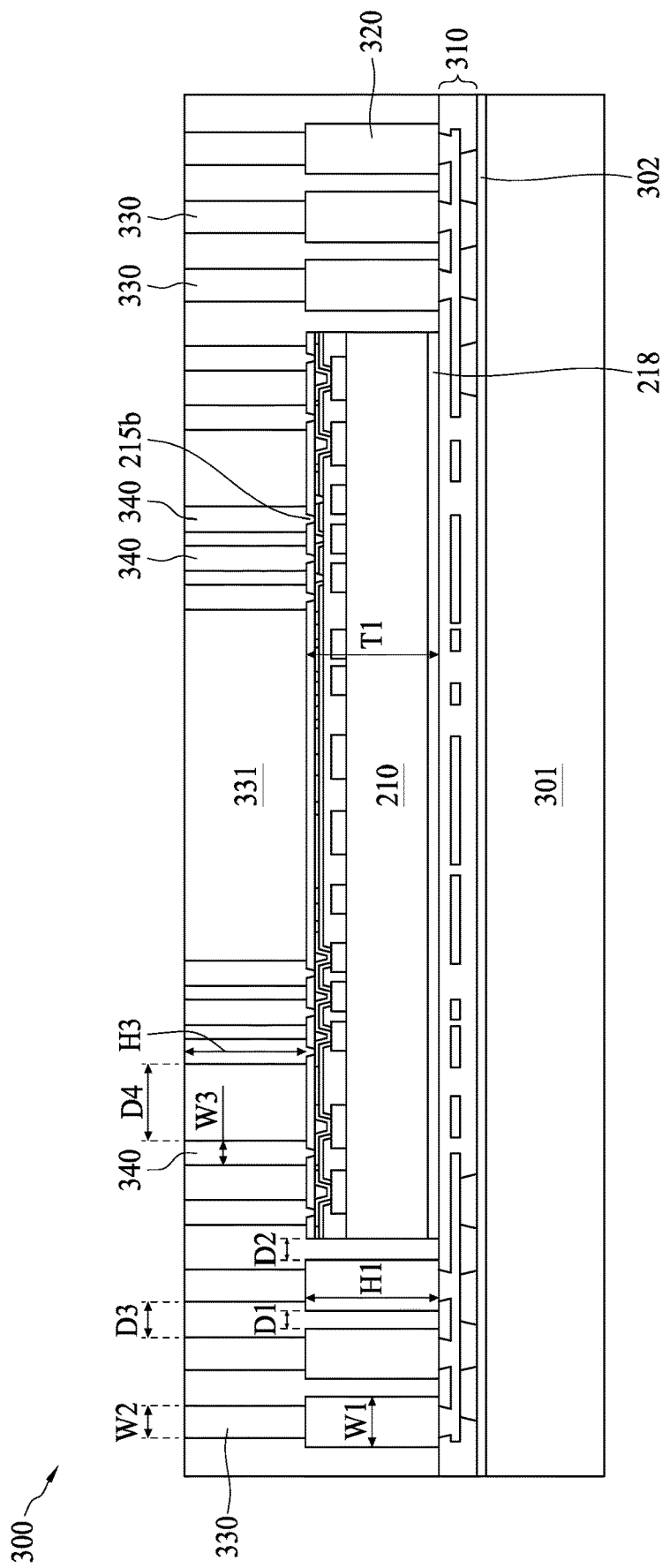

Referring to FIG. 11, in some embodiments, a conductive material is formed in the openings 332, 341 of the photoresist 331 to electrically connect to the first die 210 or the first conductive vias 320. The conductive material may be formed by CVD, ALD, plating, such as electroplating or electroless plating, or the like. The conductive material may comprise metal, such as copper, titanium, tungsten, aluminum, or the like.

In some embodiments, the second conductive vias 330 are disposed in the openings 332 of the photoresist 331 and electrically connected to the first conductive vias 320, in which each of the second conductive vias 330 corresponds to each of the first conductive vias 320. In some embodiments, the second conductive vias 330 are formed to be electrically coupled to the first conductive vias 320. In some embodiments, each of the second conductive vias 330 couples to the corresponding one of the first conductive vias 320.

In some embodiments, the third conductive vias 340 are disposed in the openings 341 of the photoresist 331 and electrically connected to the first die 210, where each of the third conductive vias 340 corresponds to one of the conductive lines 215b of the first die 210. In some embodiments, the third conductive vias 340 are formed to be electrically coupled to conductive lines 215b. In some embodiments, each of the third conductive vias 340 is electrically coupled to the corresponding one of the conductive lines 215b. In some embodiments, the forming of the second conductive vias 330 and the forming of the third conductive vias 340 are performed during a same operation.

Figure 12:
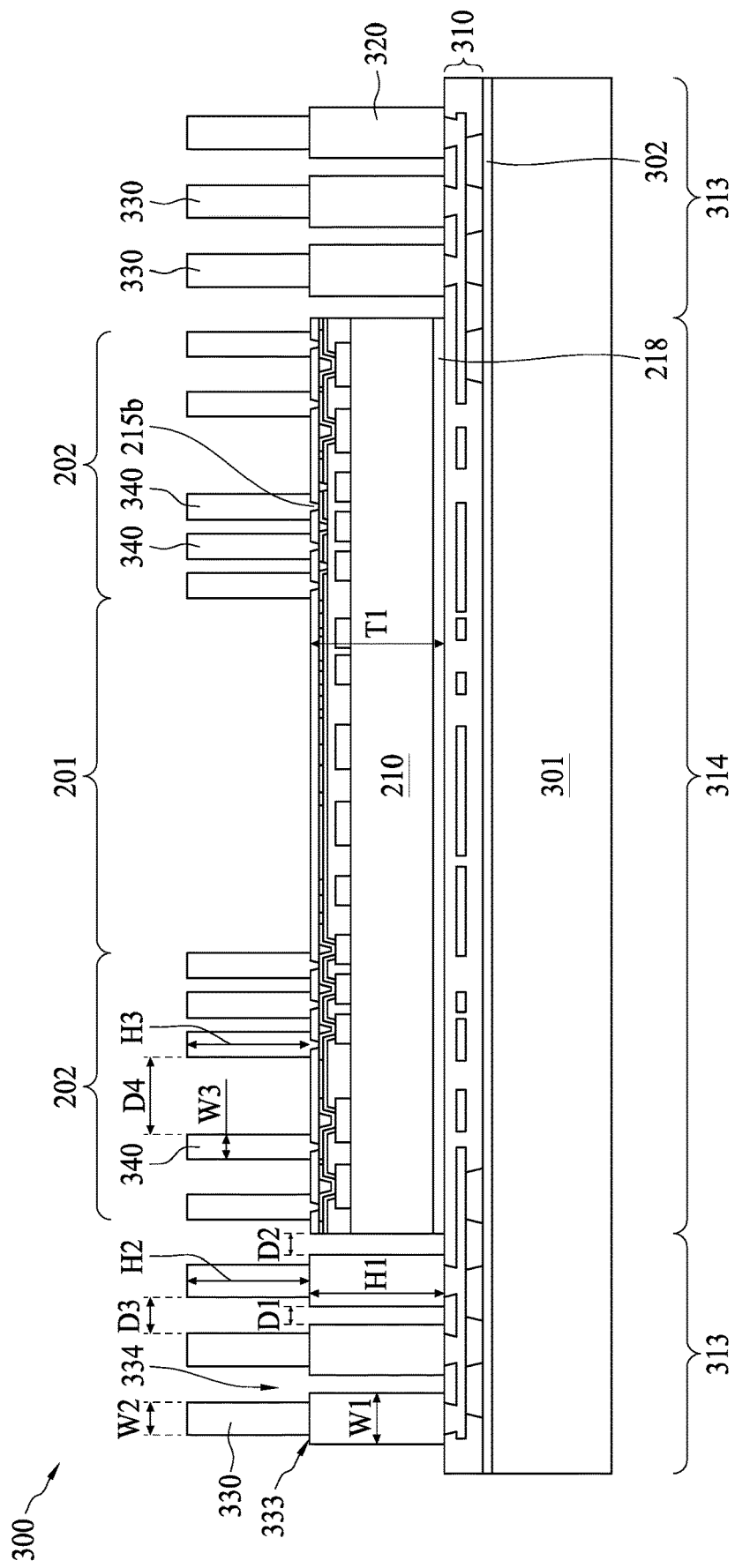

Referring to FIG. 12, the photoresist 331 are removed. The photoresist 331 may be removed by an acceptable washing or stripping process, such as using an oxygen plasma or the like.

In some embodiments, the second conductive vias 330 are disposed in the peripheral portion 315 of the first RDL 310. In some embodiments, the second conductive vias 330 surrounds the third conductive vias 340. In some embodiments, heights of the second conductive vias 330 are substantially equal. In some embodiments, a width W2 of each of the second conductive vias 330 is substantially equal to or less than the width W1 of each of the first conductive vias 320. In some embodiments, the width W2 is in a range between about 80 μm and about 380 μm. In some embodiments, the widths W2 of each of the second conductive vias 330 may be similar to or different from each other.

In some embodiments, the forming of the second conductive vias 330 includes forming a step 333 between the second conductive vias 330 and the corresponding first conductive vias 320 when the width W2 of the second conductive vias 330 is less than the width W1 of the corresponding first conductive vias 320. In some embodiments, the stepped shape 333 is formed around an interface between each of the first conductive vias 320 and the corresponding one of the second conductive vias 330. In some embodiments, the forming of the second conductive vias 330 includes forming a trench 334 in each of adjacent pairs of the first conductive vias 320 through an upper surface of the first RDL 310 to an upper surface of each of the second conductive vias 330.

In some embodiments, the distance D1 between the adjacent first conductive vias 320 is substantially equal to or greater than a distance D3 between the adjacent second conductive vias 330. In some embodiments, the distance D3 between the adjacent second conductive vias 330 is in a range between about 120 μm and about 370 μm. In some embodiments, distances D3 between the adjacent second conductive vias 330 may be similar to or different from the others.

In some embodiments, the third conductive vias 340 are disposed in the peripheral portion 202 of the first die 210. In some embodiments, heights H3 of the third conductive vias 340 are substantially equal. In some embodiments, the heights H2 of the second conductive vias 330 is substantially equal to the heights H3 of the third conductive vias 340.

In some embodiments, a width W3 of each of the third conductive vias 340 is substantially equal to or less than the width W2 of each of the second conductive vias 330. In some embodiments, the width W3 ranges between 15 μm and 60 μm. In some embodiments, widths W3 of each of the third conductive vias 340 may be similar to or different from each other.

In some embodiments, a distance D4 between the adjacent third conductive vias 340 depends on the position of the corresponding conductive lines 215b of the first die 210. In some embodiments, the distance D4 between the adjacent third conductive vias 340 is greater than 15 μm. In some embodiments, the distance D4 between the adjacent third conductive vias 340 ranges between 15 μm to 400 μm. In some embodiments, distances D4 between the adjacent third conductive vias 340 may be similar to or different from the others.

Figure 13:
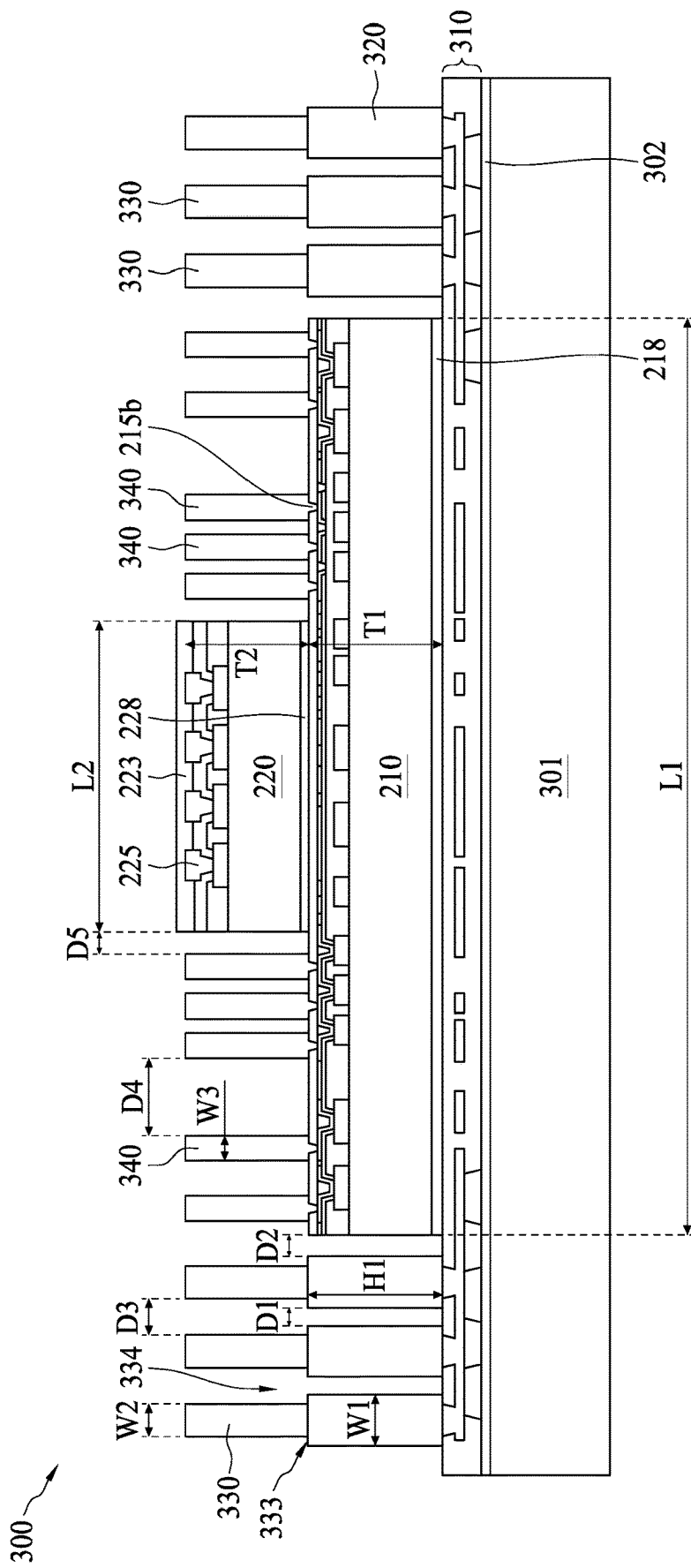

Referring to FIGS. 1B and 13, in some embodiments, in step 115, the second die 220 and the second die attach film 228 are disposed over the first die 210 and adjacent to the third conductive vias 340, the second die attach film 228 is disposed between the first die 210 and the second die 220. Although one second die 220 is illustrated, there may be a plurality of second dies 220 bonded to the first die 210, and spaces may be disposed between adjacent pairs of the second dies 220.

In some embodiments, the second die 220 is adhered to the first die 210 by the second DAF 228. In some embodiments, the second die 220 may be singulated, such as by sawing or dicing, and adhered to the first die 210 by the second DAF 228 using, for example, a pick-and-place tool. In some embodiments, the second die 220 is disposed on the first die 210. In some embodiments, the second die 210 is in contact with the first die 210. In some embodiments, the second DAF 228 is omitted, and the second die 220 is disposed in the central portion 201 of the first die 210.

In some embodiments, the third conductive vias 340 are adjacent to the second die 220. In some embodiments, the third conductive vias 340 surrounds the second die 220. In some embodiments, a distance D5 between the second die 220 and the adjacent third conductive via 340 is in a range between about 0.01 μm and about 500 μm. In some embodiments, the distance D5 is in a range between about 1 μm and about 100 μm. In some embodiments, the distance D5 is in a range between about 1 μm and about 50 μm. In some embodiments, the distances D5 between the second die 220 and different third conductive vias 340 may be similar to or different.

Figure 14:
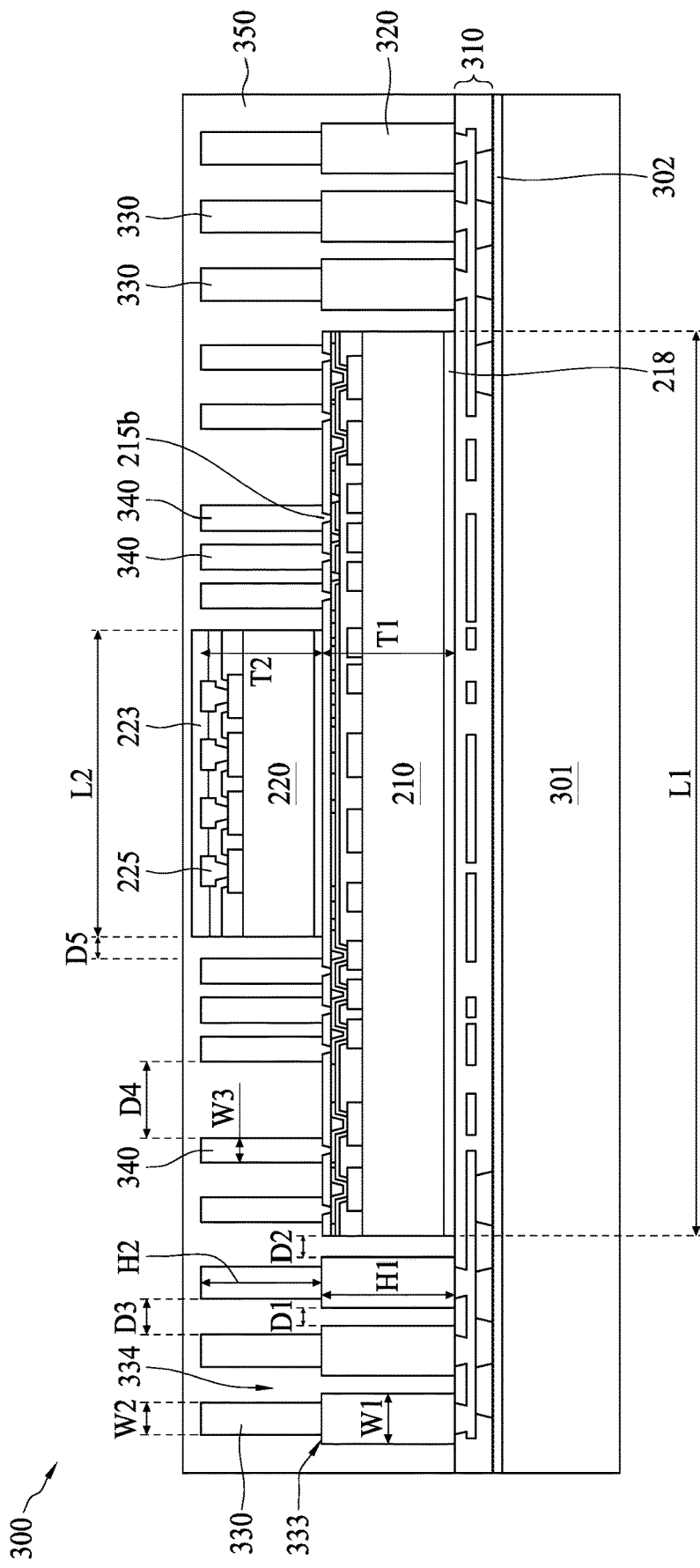

Referring to FIGS. 1B and 14, in some embodiments, in step 116, the first die 210, the second die 220, the first conductive vias 320, the second conductive vias 330 and the third conductive vias 340 are encapsulated. In some embodiments, the encapsulating of the first die 210, the second die 220, the first conductive vias 320, the second conductive vias 330 and the third conductive vias 340 are performed using the same material. In some embodiments, the first die 210, the second die 220, the first conductive vias 320, the second conductive vias 330 and the third conductive vias 340 are encapsulated during a same encapsulating operation.

In some embodiments, the first die 210, the second die 220, the first conductive vias 320, the second conductive vias 330 and the third conductive vias 340 are encapsulated by a molding material 350. In some embodiments, the molding material 350 is dispensed to fill the trench 334 and over the second conductive vias 330. The molding material 350 may include molding compound, epoxy, or the like, and may be applied by compression molding, transfer molding, or the like. The molding material 350 may be formed over the first RDL 310 such that the first conductive vias 320, the second conductive vias 330, the third conductive vias 340, the first die 210 and the second die 220 are buried or covered. In some embodiments, the molding material 350 is then cured. In some embodiments, the molding material 350 includes a same material between the first die 210 and the first conductive vias 320 and between the second die 220 and the third conductive vias 330. In some embodiments, the molding material 350 includes a filler. In some embodiments, a diameter of the filler is in a range between about 0.1 μm and about 15 μm, or in a range between about 1 μm and about 5 μm.

In some embodiments, due to unequal widths of the first conductive vias 320 and the second conductive vias 330, a portion of a top surface of at least one of the first conductive via 320 contacts the molding material 350. In some embodiments, a top surface of one of the first conductive via 320 is electrically coupled to the corresponding second conductive via 330 and contacts the molding material 350.

Figure 15:
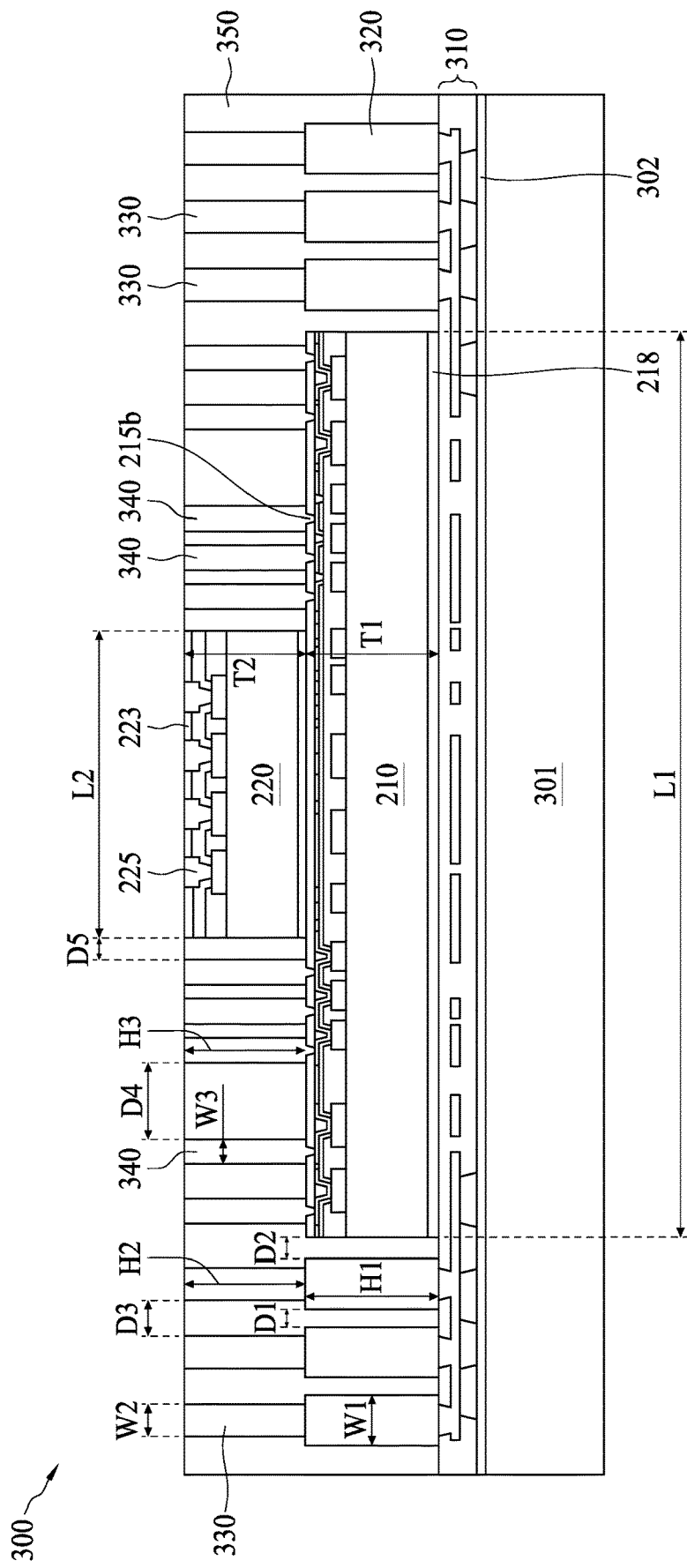

Referring to FIGS. 1B and 15, in some embodiments, in step 117, a portion of the molding material 350 is removed to expose the second die 220, the second conductive vias 330 and the third conductive vias 340. In some embodiments, a portion of the second passivation layer 223 of the second die 220 is removed to expose the second conductive lines 225 of the second die 220. In some embodiments, a planarization process is performed on the molding material 350 to expose the second conductive vias 330, the third conductive vias 340 and the conductive lines 225 of the second die 220.

The planarization process may grind the molding material 350 and the second passivation layer 223. The planarization process may be, for example, a chemical-mechanical polish (CMP), a grinding process, or the like. Top surfaces of the second conductive vias 330, the third conductive vias 340, the conductive lines 225 and the molding material 350 are coplanar through the planarization operation. In some embodiments, the planarization may be omitted, for example, if the second conductive vias 330, the third conductive vias 340 and conductive lines 215b are already exposed through the molding material 350.

In some embodiments, a top surface of the second die 220 is level with top surfaces of the second conductive vias 330 or top surfaces of the third conductive vias 340. In some embodiments, a top surface of at least one of the second conductive vias 330 is level with a top surface of the conductive lines 225 of the second die 220. In some embodiments, a top surface of one of the third conductive vias 340 is level with a top surface of the conductive lines 225 of the second die 220.

In some embodiments, a height H2 of each of the second conductive vias 330 is substantially equal to a thickness of the second die 220. In some embodiments, a height H3 of each of the third conductive vias 340 is substantially equal to a thickness of the second die 220. In some embodiments, the total thickness T2 of the second die 220 and the second DAF 228 is substantially equal to the height H2 of each of the second conductive vias 330. In some embodiments, the total thickness T2 of the second die 220 and the second DAF 228 is substantially equal to the height H3 of each of the third conductive vias 340. In some embodiments, a height H2 of each of the second conductive vias 330 is in a range between about 70 µm and about 150 µm. In some embodiments, a height H3 of each of the third conductive vias 340 is in a range between about 70 µm and about 150 µm. In some embodiments, the height H2 of each of the second conductive vias 330 is substantially equal to the height H3 of each of the third conductive vias 340.

Figure 16:
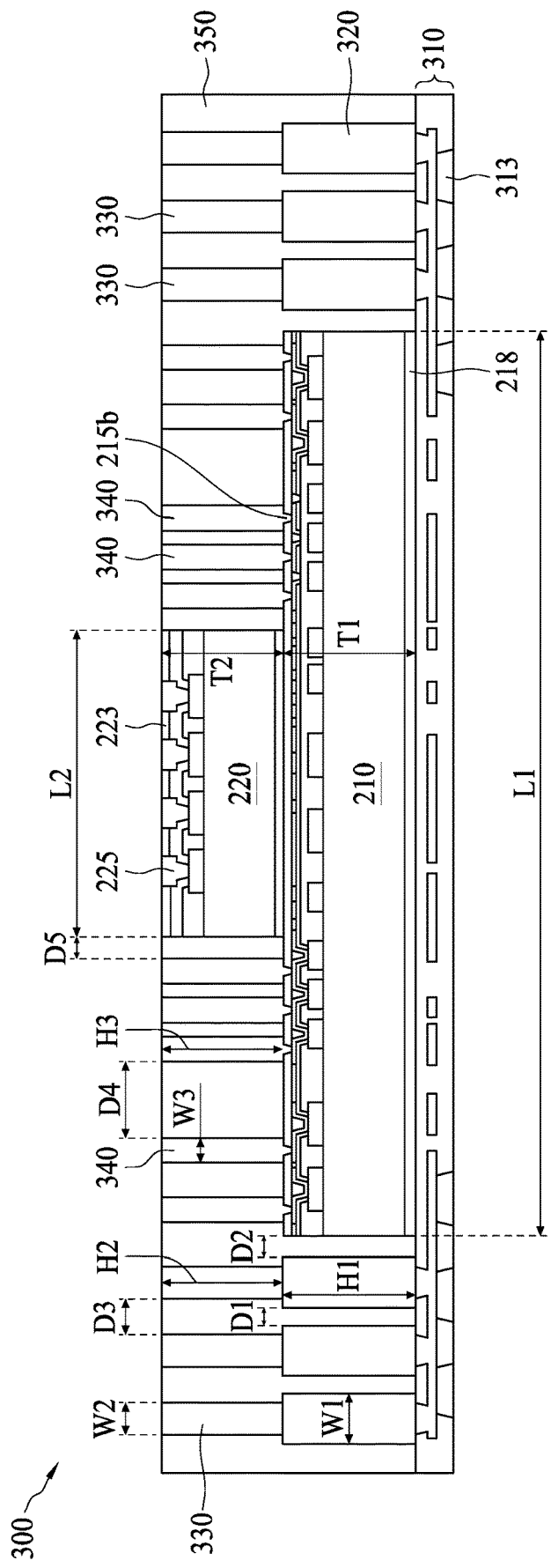

Referring to FIGS. 16, in some embodiments, the carrier substrate 301 is removed. In some embodiments, a de-bonding operation is performed to detach (de-bond) the carrier substrate 301 from the first RDL 310. In some embodiments, the de-bonding includes projecting light, such as a laser light or an UV light, on the release layer 302 so that the release layer 302 decomposes under the heat of the light and the carrier substrate 301 can be separated from the first RDL 310. In some embodiments, the conductive pad 313 such as solder is exposed through the first dielectric layer 312 after the carrier substrate 301 is removed. The exposed portion of the conductive pad 313 may be further electrically connected to other component (not shown).

Figure 17:
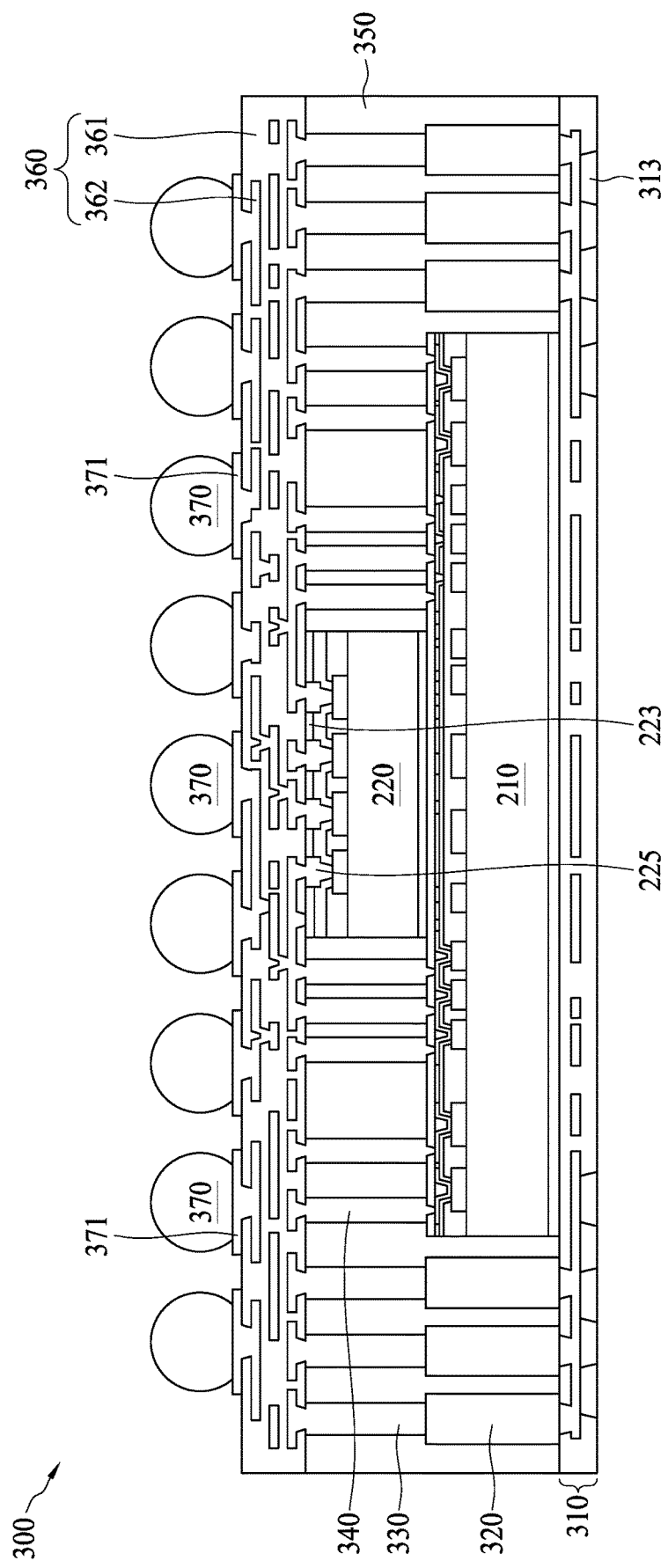

Referring to FIGS. 1B and 17, in some embodiments, in step 118, a second RDL 360 is formed over the second die 220, the second conductive vias 330, and the third conductive vias 340. Formation of the second RDL 360 may be similar to the formation of the first RDL 310. In some embodiments, the second RDL 360 is also formed over the molding material 350.

In some embodiments, the second RDL 360 includes a second dielectric layer 361, and a second metal layer 362 surrounded by the second dielectric layer 361. In some embodiments, portions of the second metal layer 362 exposed through the second dielectric layer 361. The configurations and materials of the second dielectric layer 361 and the second metal layer 362 a may be similar to those for forming the first RDL 310, and their detailed descriptions are not repeated herein for brevity.

In some embodiments, the second metal layer 362 is electrically connected to the second die 220. In some embodiments, the second metal layer 362 is electrically coupled to the conductive lines 225 of the second die 220. In some embodiments, each of the third conductive vias 340 is electrically connected to the second metal layer 362 and the first die 210. In some embodiments, one of the third conductive vias 340 includes one end electrically coupled to the second metal layer 362 of the second RDL 360, and the other end electrically coupled to the corresponding conductive lines 215b of the first die 210. In some embodiments, the second metal layer 362 is electrically connected to the first RDL 310 through the second conductive vias 330 and the first conductive vias 320. In some embodiments, the second metal layer 362 electrically couples to the second conductive vias 330.

In some embodiments, conductive connectors 370 are formed on the second RDL 360 and electrically connected to the second metal layer 362. The conductive connectors 370 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 370 may include a conductive material such as solder, copper, aluminum, gold, nickel, silver, palladium, tin, the like, or a combination thereof. In some embodiments, the conductive connectors 370 are formed by initially forming a layer of solder through methods such as evaporation, electroplating, printing, solder transfer, ball placement, or the like. Once a solder layer has been formed over the second RDL 360, a reflow may be performed in order to shape the material into the desired bump shapes.

In another embodiment, the conductive connectors 370 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, under bump metallurgies (UBMs) 371 are formed between the second RDL 360 and the conductive connectors 370. In some embodiments, the UBMs 371 are electrically connected to the second metal layer 362 of the second RDL 360 and the conductive connectors 370. The semiconductor structure 300 is completed.

Figure 18:
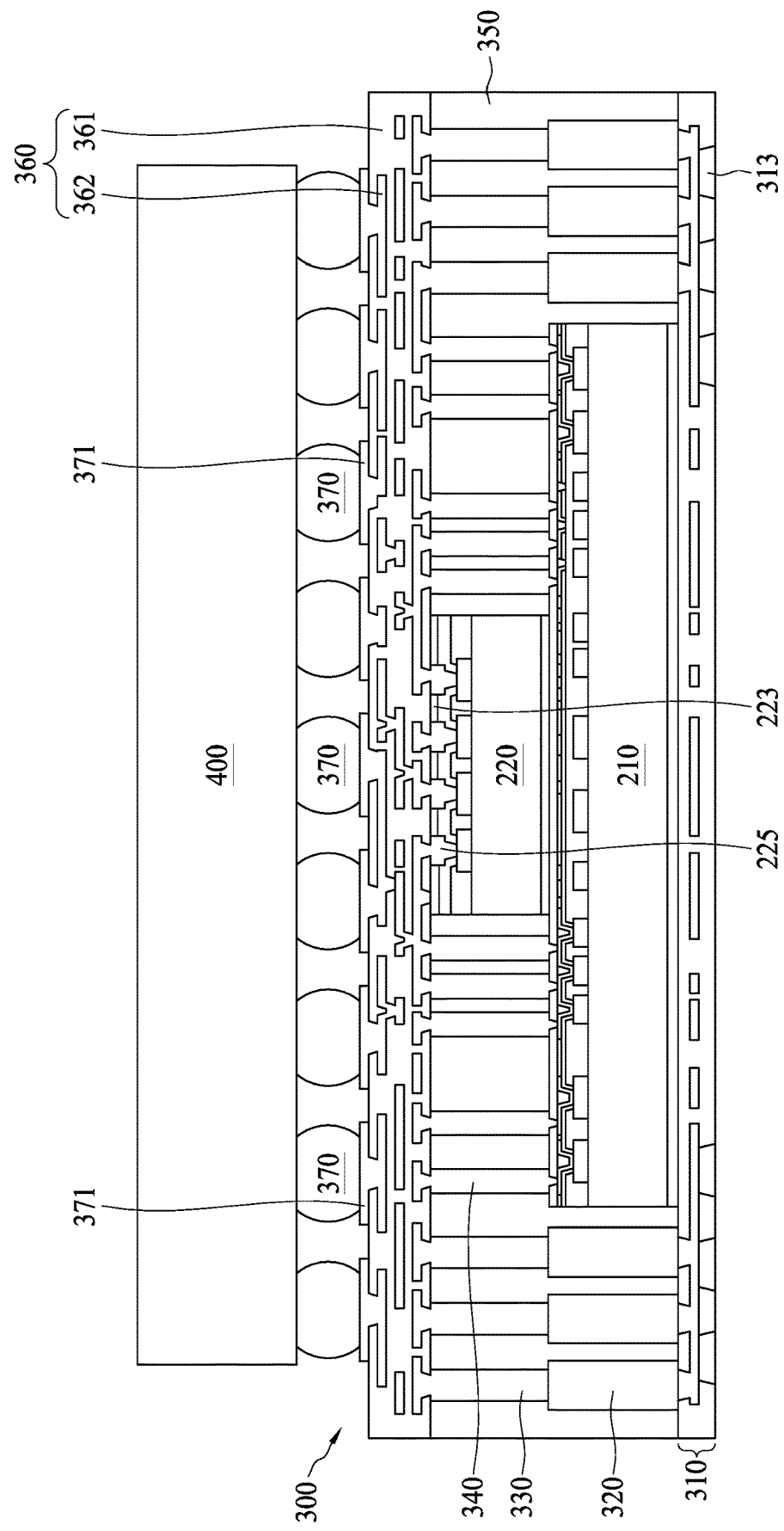

In some embodiments, the semiconductor structure 300 includes the first die 210 disposed over a first RDL 310, the second die 220 disposed over the first die 210, the plurality of first conductive vias 320 disposed over the first RDL 310 and adjacent to the first die 210, and the plurality of second conductive vias 330 disposed over the first conductive vias 320. Each of the second conductive vias 330 corresponding to one of the first conductive vias 320. In some embodiments, the semiconductor structure 300 further includes the plurality of third conductive vias 340 disposed over the first die 210 and adjacent to the second die 220, and the molding material 350 encapsulating the first die 210, the second die 220, the first conductive vias 320, the second conductive vias 330 and the third conductive vias 340. In some embodiments, the semiconductor structure 300 further includes the second RDL 360 over the second die 220, the second conductive vias 330, the third conductive vias 340 and the molding material 350. Referring to FIG. 18, in some embodiments, the semiconductor structure 300 is electrically coupled to other device 400.

Figure 19:
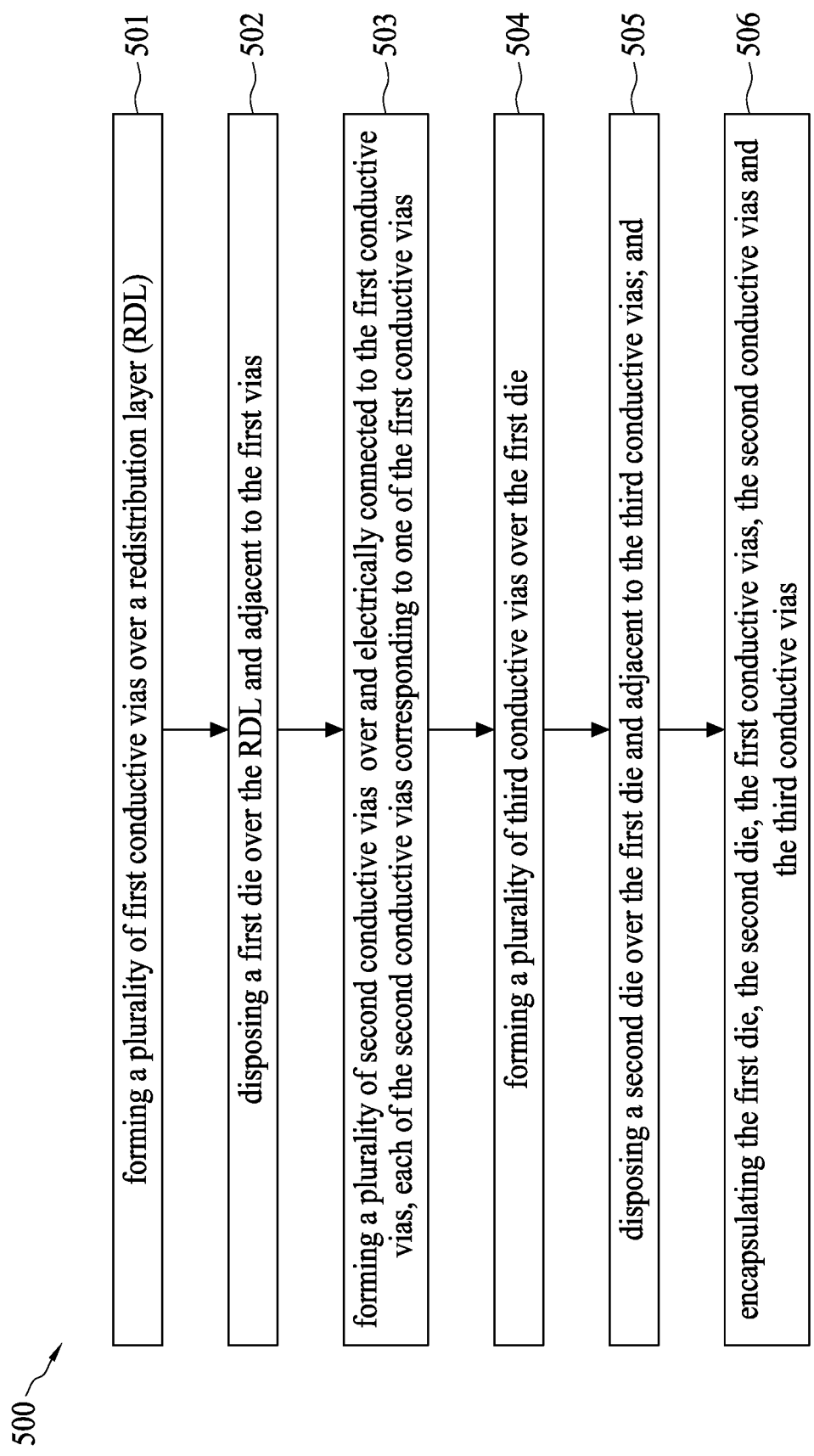
FIG. 19 is a flowchart illustrating a method, in accordance with some embodiments of the present disclosure.

FIG. 19 is a flowchart of a method 500 in accordance with some embodiments. Additional steps can be provided before, during, and after the steps shown in FIG. 19, and some of the steps described below can be replaced or eliminated in other embodiments of the method 500. The order of the steps may be interchangeable.

In step 501, a plurality of first conductive vias over a redistribution layer (RDL) is formed. In step 502, a first die over the RDL and adjacent to the first vias is disposed. In step 503, a plurality of second conductive vias is formed over and electrically connected to the first conductive vias, each of the second conductive vias corresponding to one of the first conductive vias. In step 504, a plurality of third conductive vias is formed over the first die. In step 505, a second die is disposed over the first die and adjacent to the third conductive vias. In step 506, the first die, the second die, the first conductive vias, the second conductive vias and the third conductive vias are encapsulated.

Figure 20:
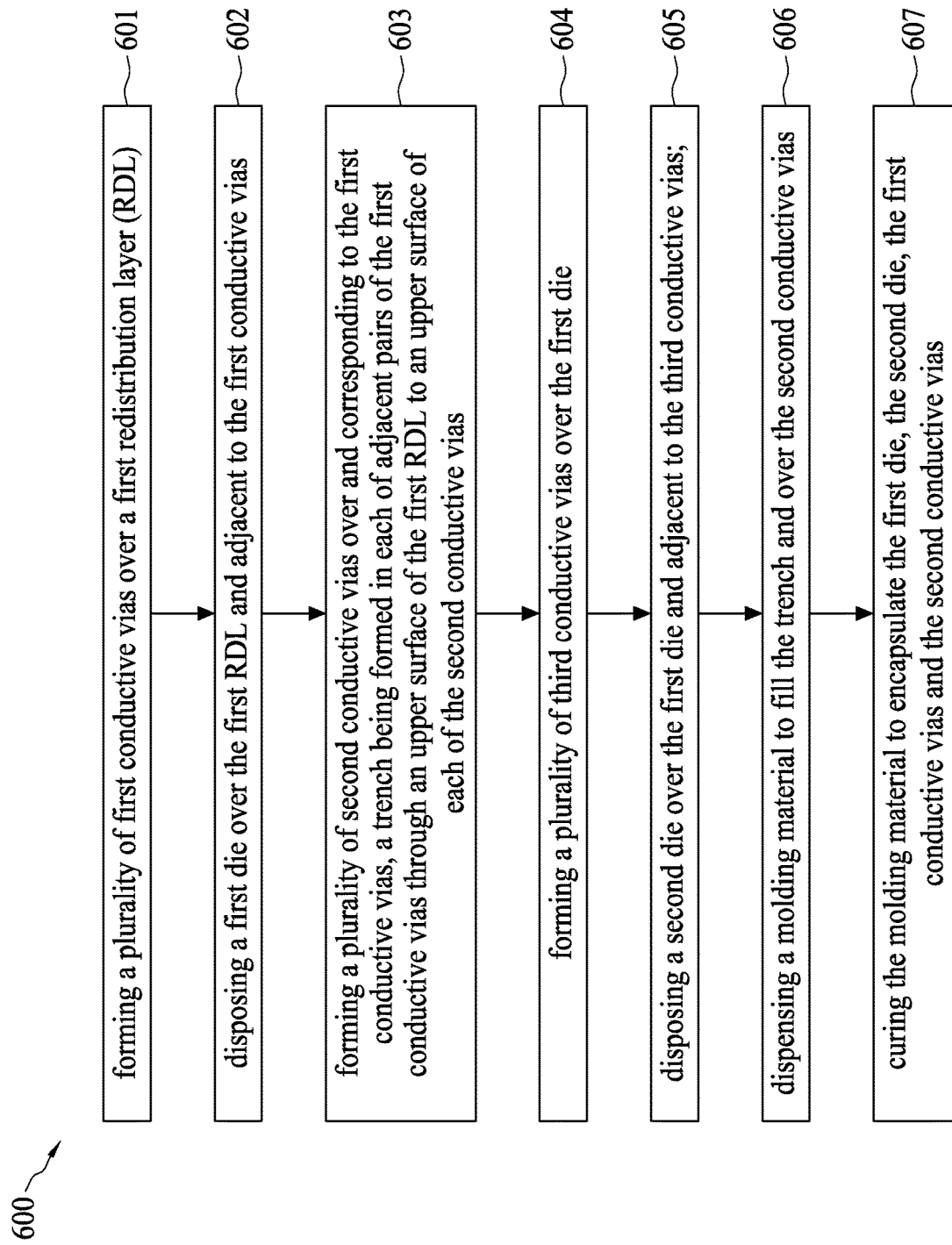
FIG. 20 is a flowchart illustrating a method, in accordance with some embodiments of the present disclosure.

FIG. 20 is a flowchart of a method 600 in accordance with some embodiments. Additional steps can be provided before, during, and after the steps shown in FIG. 20, and some of the steps described below can be replaced or eliminated in other embodiments of the method 500. The order of the steps may be interchangeable.

In step, 601 a plurality of first conductive vias over a first redistribution layer (RDL) is formed. In step 602, a first die is disposed over the first RDL and adjacent to the first conductive vias. In step 603, a plurality of second conductive vias is formed over and corresponding to the first conductive vias, a trench being formed in each of adjacent pairs of the first conductive vias through an upper surface of the first RDL to an upper surface of each of the second conductive vias. In step 604, a plurality of third conductive vias is formed over the first die. In step 605, a second die is disposed over the first die and adjacent to the third conductive vias. In step 606, a molding material is dispensed to fill the trench and over the second conductive vias. In step 607, the molding material is cured to encapsulate the first die, the second die, the first conductive vias and the second conductive vias.

In accordance with some embodiments of the disclosure, a semiconductor structure includes a first die; a second die disposed over the first die; a plurality of first conductive vias adjacent to the first die. The semiconductor structure further includes a plurality of second conductive vias disposed over the first conductive vias, each of the second conductive vias corresponding to one of the first conductive vias; a plurality of third conductive vias disposed over the first die and adjacent to the second die; and a molding material encapsulating the first die, the second die, the first conductive vias, the second conductive vias and the third conductive vias. A stepped shape is formed around an interface between each of the first conductive vias and the corresponding one of the second conductive vias.

In accordance with some embodiments of the disclosure, a semiconductor structure includes a first die over a redistribution layer (RDL); a second die disposed over the first die; a plurality of first conductive vias adjacent to the first die; and a plurality of second conductive vias disposed over the first conductive vias, each of the second conductive vias corresponding to one of the first conductive vias. The semiconductor structure further includes a plurality of third conductive vias disposed over the first die and adjacent to the second die; a plurality of trenches between each of adjacent pairs of the plurality of first conductive vias through an upper surface of the RDL to an upper surface of each of the plurality of second conductive vias; and a molding material encapsulating the first die, the second die, the first conductive vias, the second conductive vias and the third conductive vias and disposed in the plurality of trenches.

In accordance with some embodiments of the disclosure, a semiconductor structure includes a first die; a second die disposed over the first die; and a plurality of first conductive vias adjacent to the first die. The semiconductor structure further includes a plurality of second conductive vias disposed over the first conductive vias, each of the second conductive vias corresponding to one of the first conductive vias; a plurality of third conductive vias disposed over the first die and adjacent to the second die; and a molding material encapsulating the first die, the second die, the first conductive vias, the second conductive vias and the third conductive vias, and disposed in a space between the plurality of the second conductive vias and a space between the first die and the adjacent one of the plurality of first conductive vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first die;
    a second die disposed over the first die;
    a plurality of first conductive vias adjacent to the first die;
    a plurality of second conductive vias disposed over the plurality of first conductive vias, each of the plurality of second conductive vias corresponding to one of the plurality of first conductive vias;
    a plurality of third conductive vias disposed over the first die and adjacent to the second die; and
    a molding material encapsulating the first die, the second die, the plurality of first conductive vias, the plurality of second conductive vias and the plurality of third conductive vias,
    wherein a width of each of the plurality of first conductive via is greater than the corresponding one of the plurality of second conductive vias.

2. The semiconductor structure of claim 1, wherein top surfaces of the plurality of first conductive vias are level with a top surface of the first die.

3. The semiconductor structure of claim 1, wherein a top surface of the second die is level with top surfaces of the plurality of second conductive vias or top surfaces of the plurality of third conductive vias.

4. The semiconductor structure of claim 1, wherein a stepped shape is formed around an interface between each of the plurality of first conductive vias and corresponding one of the plurality of second conductive vias.

5. The semiconductor structure of claim 1, wherein the molding material includes a same material between the first die and the plurality of first conductive vias and between the second die and the plurality of third conductive vias.

6. The semiconductor structure of claim 1, wherein a distance between adjacent of the plurality of first conductive vias is substantially equal to or greater than a distance between adjacent of the plurality of second conductive vias.

7. A semiconductor structure, comprising:
    a first die over a redistribution layer (RDL);
    a second die disposed over the first die;
    a plurality of first conductive vias adjacent to the first die;
    a plurality of second conductive vias disposed over the plurality of first conductive vias, each of the plurality of second conductive vias corresponding to one of the plurality of first conductive vias;
    a plurality of third conductive vias disposed over the first die and adjacent to the second die;
    a plurality of trenches between each of adjacent pairs of the plurality of first conductive vias through an upper surface of the RDL to an upper surface of each of the plurality of second conductive vias; and
    a molding material encapsulating the first die, the second die, the plurality of first conductive vias, the plurality of second conductive vias and the plurality of third conductive vias and disposed in the plurality of trenches.

8. The semiconductor structure of claim 7, wherein a thickness of the second die is substantially equal to a height of the plurality of third conductive vias.

9. The semiconductor structure of claim 7, wherein the molding material includes a same material between the first die and the plurality of first conductive vias and between the second die and the plurality of third conductive vias.

10. The semiconductor structure of claim 7, wherein the plurality of third conductive vias are electrically coupled to the first die.

11. The semiconductor structure of claim 7, wherein the first die includes:
a first substrate;
a first conductive pad over the first substrate;
a first passivation layer over the first conductive pad; and
a die film attached to the first substrate on a side of the first substrate opposite to the first conductive pad.

12. The semiconductor structure of claim 11, further comprising:
a plurality of die connectors electrically connected to the first conductive pad and disposed over the first passivation layer of the first die.

13. The semiconductor structure of claim 12, wherein the plurality of third conductive vias are electrically coupled to the plurality of die connectors.

14. The semiconductor structure of claim 7, wherein a stepped shape is formed around an interface between each of the plurality of first conductive vias and the corresponding one of the plurality of second conductive vias.

15. A semiconductor structure, comprising:
a first die;
a second die disposed over the first die;
a plurality of first conductive vias adjacent to the first die;
a plurality of second conductive vias disposed over the plurality of first conductive vias, each of the plurality of second conductive vias corresponding to one of the plurality of first conductive vias;
a plurality of third conductive vias disposed over the first die and adjacent to the second die; and
a molding material encapsulating the first die, the second die, the plurality of first conductive vias, the plurality of second conductive vias and the plurality of third conductive vias, and disposed in a contiguous manner from a location between the plurality of the second conductive vias to another location between the plurality of first conductive vias.

16. The semiconductor structure of claim 15, wherein the second die is disposed between the plurality of third conductive vias.

17. The semiconductor structure of claim 15, wherein a width the plurality of third conductive vias is substantially equal to or less than the width of each of the plurality of second conductive vias.

18. The semiconductor structure of claim 15, wherein a stepped shape is formed around an interface between each of the plurality of first conductive vias and the corresponding one of the plurality of second conductive vias.

19. The semiconductor structure of claim 15, further comprising:
a first redistribution layer (RDL) disposed under the first die and the plurality of the first conductive dies; and
a second RDL disposed over the second die, the plurality of second conductive vias, and the plurality of third conductive vias,
wherein the molding material is disposed between the first RDL and the second RDL.

20. The semiconductor structure of claim 15, wherein a distance between adjacent of the plurality of first conductive vias is less than a distance between adjacent of the plurality of second conductive vias.

* * * * *